United States Patent [19]
Nii

[11] Patent Number: 6,046,949
[45] Date of Patent: Apr. 4, 2000

[54] SEMICONDUCTOR INTEGRATED CIRCUIT

[75] Inventor: Koji Nii, Tokyo, Japan

[73] Assignee: Mitsubishi Denki Kabushiki Kaisha, Tokyo, Japan

[21] Appl. No.: 09/123,422

[22] Filed: Jul. 28, 1998

[30] Foreign Application Priority Data

Dec. 24, 1997 [JP] Japan .................................. 9-354919
Jun. 8, 1998 [JP] Japan .................................. 10-159115

[51] Int. Cl.⁷ .................................................. G11C 7/00
[52] U.S. Cl. ........................................................ 365/203
[58] Field of Search .................................. 365/203, 154, 365/156, 205, 207, 208

[56] References Cited

U.S. PATENT DOCUMENTS 5,574,687  11/1996  Nakase ..................................... 365/203
5,796,665   8/1998  Ternullo .................................. 365/203

FOREIGN PATENT DOCUMENTS 61-96587   5/1986  Japan .
5-325566  12/1993  Japan .
6-12879    1/1994  Japan .

OTHER PUBLICATIONS

K. Suzuki et al., "A 300 MIPS/W RISC Core Processor with Variable Supply–Voltage Scheme in Variable Threshold–Votage CMOS," *IEEE 1997 Custom Integrated Circuits Conference*, pp. 587–590.

*Primary Examiner*—Arin Zarabian
*Attorney, Agent, or Firm*—Burns, Doane, Swecker & Mathis, LLP

[57] ABSTRACT

Provided is a semiconductor integrated circuit capable of reducing power consumption in an electric potential converting circuit for converting an electric potential of a bit line. The semiconductor integrated circuit according to the present invention comprises bit lines BL1 and BL2, a precharge circuit PCC which is connected to the bit lines BL1 and BL2, an electric potential converting circuit SA, and a memory cell MC. The electric potential converting circuit SA has a current path for transistors T3, T4 and T6 and a current path for the transistor T3 and transistors T5 and T9 provided between a high potential V2 and a ground potential GND. Respective gate electrodes of the transistors T3, T4, T6 and T9 receive a mode signal PC, and respective gate electrodes of the transistors T4 and T5 are connected to the bit lines BL1 and BL2.

7 Claims, 16 Drawing Sheets

F I G. 1 5
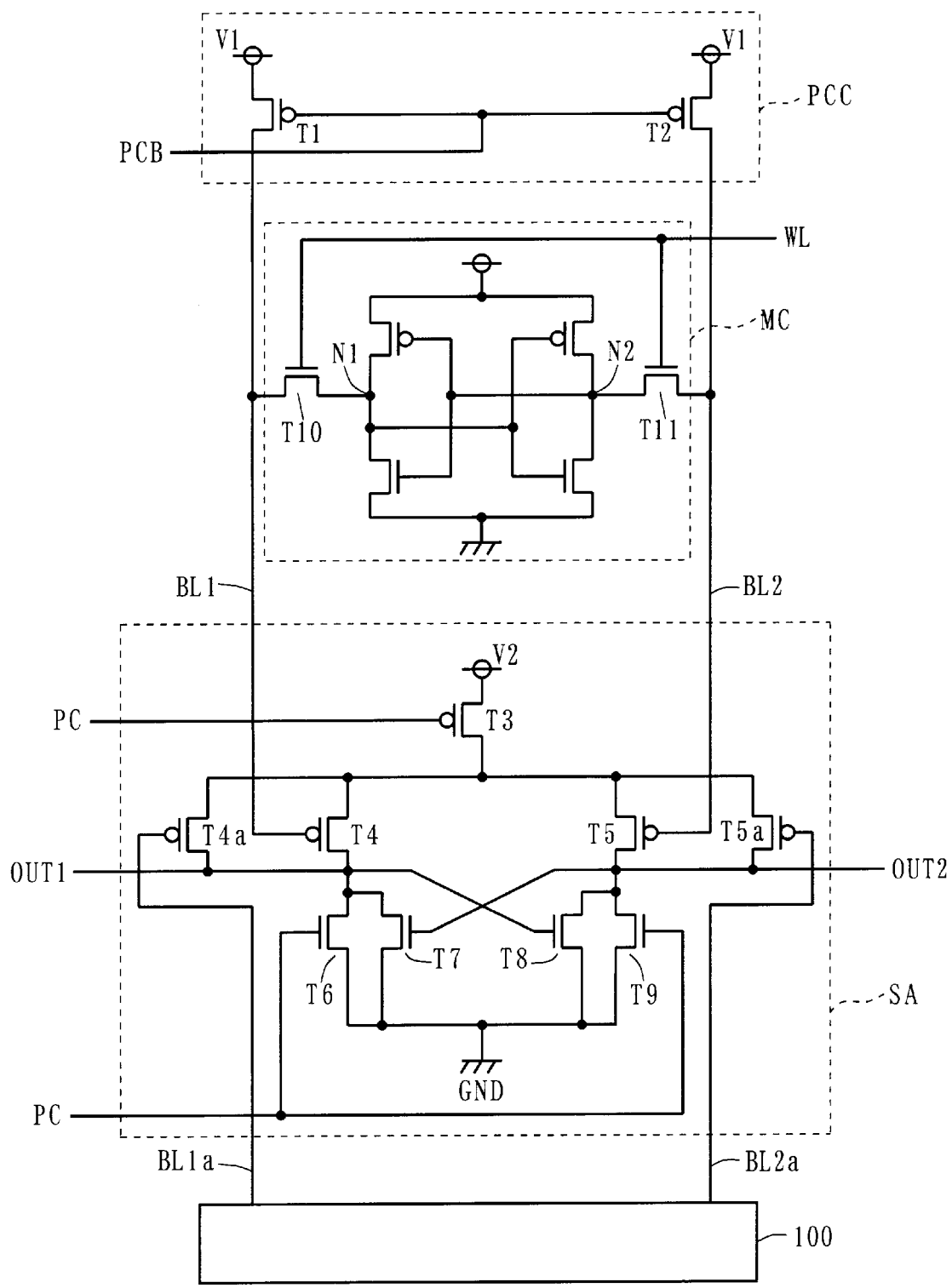

SEMICONDUCTOR INTEGRATED CIRCUIT

BACKGROUND OF THE INVENTION

1. Field of the Invention

The present invention relates to a semiconductor integrated circuit such as a CMOS static RAM, and more particularly to a semiconductor integrated circuit capable of reducing power consumption.

2. Description of the Background Art

FIG. 9 is a circuit diagram for explaining a semiconductor integrated circuit according to the prior art. Japanese Patent Application Laid-Open No. 5-325566 has described, in detail, the contents shown in FIG. 9. In FIG. 9, BL1 and BL2 denote bit lines, MC0 denotes a memory cell connected to the bit lines BL1 and BL2, PCC0 denotes a precharge circuit connected to the bit lines BL1 and BL2 for precharging the bit lines BL1 and BL2 in response to a mode signal PCB, and SA0 denotes an electric potential converting circuit (a sense amplifier) connected to the bit lines BL1 and BL2 for amplifying, converting and outputting electric potentials of the bit lines BL1 and BL2.

The precharge circuit PCC0 includes PMOS transistors T1 and T2. V1 denotes a precharge potential.

The memory cell MC0 includes NMOS transistors T10 and T11. Electric potentials of nodes N1 and N2 represent data, one of which is at an "H" level and the other is at an "L" level.

The electric potential converting circuit SA0 includes PMOS transistors T4 and T5, and NMOS transistors T6 to T9, T31 and T32. GND denotes a ground potential, and V2 denotes a potential which is higher than the ground potential GND.

Mode signals PC and PCB are complementary to each other.

FIG. 10 is a timing chart showing operation of the circuit in FIG. 9. At a time t10, the mode signal PC, the mode signal PCB, an electric potential of a word line WL, the electric potential of the node N1 and the electric potential of the node N2 are at "H", "L", "L", "L" and "H" levels, respectively. At a time t11, the mode signal PC falls and the mode signal PCB rises. At a time t12, the electric potential of the word line WL rises. At a time t13, the mode signal PC rises, the mode signal PCB falls, and the electric potential of the word line WL falls. A period for which the mode signal PC is falling, for example, between the times t11 and t13, will be hereinafter referred to as a read mode, and other periods will be hereinafter referred to as a precharge mode.

With a circuit structure shown in FIG. 9, the transistors T4, T6, T31 and T7 are ON, OFF, OFF and OFF immediately before the time t13 that the precharge mode is started, respectively. In a state of transition from the read mode to the precharge mode, the mode signal PC first rises so that the transistor T6 is turned from OFF to ON. At the same time, the transistor T1 is turned from OFF to ON so that the bit line BL1 is precharged. The electric potential of the bit line BL1 is raised. However, a capacity of the bit line BL1 (including a capacity of the memory cell MC0) is particularly large. Therefore, the electric potential of the bit line BL1 is raised slowly.

At a time t14, the electric potential of the bit line BL1 is set to a threshold voltage of the transistor T31 so that the transistor T31 is turned from OFF to ON. At a time t15, the electric potential of the bit line BL1 is set to a threshold voltage of the transistor T4 so that the transistor T4 is turned from ON to OFF. Accordingly, the transistors T4, T6 and T31 are simultaneously turned ON between the times t14 and t15. Therefore, a current flows from the high potential V2 to the ground potential GND through these transistors.

In the circuit shown in FIG. 9, thus, a period for which the current flows into the electric potential converting circuit becomes long depending on a change in the electric potential of the bit line. Consequently, power consumption is increased.

Furthermore, Japanese Patent Application Laid-Open No. 6-12879 has described technology related to the electric potential converting circuit. In this technology, two sense amplifiers are provided and the number of elements is greater than in the electric potential converting circuit shown in FIG. 9. For this reason, a leak current or the like is easily generated and power consumption is increased.

As described above, the prior art has had a problem that the power consumption is increased in the electric potential converting circuit.

SUMMARY OF THE INVENTION

A first aspect of the present invention is directed to a semiconductor integrated circuit, comprising at least one bit line, at least one memory cell connected to the bit line, at least one precharge circuit connected to the bit line for precharging the bit line, and an electric potential converting circuit connected to the bit line for converting an electric potential of the bit line, wherein the electric potential converting circuit includes first to third transistors which are sequentially connected in series between first and second potentials, an output of the electric potential converting circuit is a node of the second and third transistors, the first transistor receives a mode signal at a control electrode and is turned OFF or ON depending on whether the mode signal indicates a predetermined mode, a control electrode of the second transistor is connected to the bit line, the third transistor receives the mode signal at a control electrode and is turned ON or OFF depending on whether the mode signal indicates the predetermined mode, and the precharge circuit receives the mode signal and precharges the bit line to an electric potential with which the second transistor is turned OFF only when the mode signal indicates the predetermined mode.

A second aspect of the present invention is directed to the semiconductor integrated circuit, wherein the precharge circuit includes a fourth transistor having a control electrode for receiving the mode signal, a first current electrode for receiving a precharge potential and a second current electrode connected to the bit line.

A third aspect of the present invention is directed to the semiconductor integrated circuit, wherein the precharge circuit further includes a fifth transistor which is diode-connected between the first current electrode and the precharge potential.

Preferably, according to a fourth aspect of the present invention, in the semiconductor integrated circuit of the first aspect, the bit line includes first and second bit lines; the memory cell includes a first memory cell connected to the first bit line and a second memory cell connected to the second bit line; the second transistor includes a sixth transistor for the first bit line and a seventh transistor for the second bit line, the sixth and seventh transistors being connected in parallel between the first and third transistors, the sixth transistor having a control electrode connected to the first bit line, the seventh transistor having a control electrode connected to the second bit line; the predetermined mode is one of first and second predetermined modes; the precharge circuit includes a first precharge circuit connected to the first bit line and a second precharge circuit connected to the second bit line; the first precharge circuit precharges the first bit line to a potential at which the sixth transistor is turned OFF only when in the first predetermined mode; and the second precharge circuit precharges the second bit line to a potential at which the seventh transistor is turned OFF only when in the second predetermined mode.

Preferably, according to a fifth aspect of the present invention, in the semiconductor integrated circuit of the fourth aspect, the first transistor includes an eighth transistor for the first bit line, the eighth transistor being connected between the first potential and the sixth transistor, and a ninth transistor for the second bit line, the ninth transistor being connected between the first potential and the seventh transistor, the eighth transistor being turned ON/OFF depending on whether or not the mode signal indicates the first predetermined mode, the ninth transistor being turned ON/OFF depending on whether or not the mode signal indicates the second predetermined mode.

Preferably, according to a sixth aspect of the present invention, in the semiconductor integrated circuit of the fifth aspect, the third transistor includes a tenth transistor for the first bit line and an eleventh transistor for the second bit line, the tenth and eleventh transistors being connected in series between the second transistor and the second potential, the tenth transistor being turned ON/OFF depending on whether or not the mode signal indicates the first predetermined mode, the eleventh transistor being turned ON/OFF depending on whether or not the mode signal indicates the second predetermined mode.

Preferably, according to a seventh aspect of the present invention, in the semiconductor integrated circuit of the first aspect, the memory cell holds data to be outputted to the bit line, and the semiconductor integrated circuit further comprises: a bit line potential retaining circuit for selectively connecting the bit line to a potential at which the second transistor is turned OFF, depending on whether or not the data is at the potential at which the second transistor is turned OFF, when the mode signal indicates a mode different from the predetermined mode, wherein the electric potential converting circuit further includes a twelfth transistor connected between a connecting point of the second and third transistors and the second potential, the twelfth transistor being turned ON/OFF depending on whether or not the data is at the potential at which the second transistor is turned OFF when the mode signal indicates a mode different from the predetermined mode.

According to the first aspect of the present invention, the following function and effect can be obtained. The second transistor responds to the mode signal less instantly than the first and third transistors by the influence of the bit line and the memory cell. The electric potential of the bit line is precharged, by the precharge circuit, to the electric potential with which the second transistor is turned OFF when the mode signal indicates the predetermined mode, and depends on the memory cell when the mode signal indicates a mode other than the predetermined mode.

When the mode signal indicates the predetermined mode, the output of the electric potential converting circuit is precharged to the second potential because the second and third transistors are OFF and ON respectively. Consequently, a current does not flow between the first and second potentials. In a transient state in which the mode signal indicates a mode other than the predetermined mode, first of all, the first and third transistors instantly respond to the mode signal to perform ON/OFF switching operation. In that case, the second transistor does not instantly respond to the mode signal. Therefore, the second transistor is kept OFF. Accordingly, a current does not flow between the first and second potentials in the transient state. When the mode signal indicates the mode other than the predetermined mode, the first and third transistors are ON and OFF respectively. The second transistor is turned ON or OFF depending on the memory cell. While the output of the electric potential converting circuit keeps the second potential when the second transistor is OFF, it is set to the first potential when the second transistor is ON. In the transient state from the different mode to the predetermined mode indicated by the mode signal, first of all, the first and third transistors instantly respond to the mode signal to perform the ON/OFF switching operation respectively. In this case, when the second transistor is kept OFF, a current does not flow between the first and second potentials. When the second transistor is ON, the current flows between the first and second potentials. The period for which the current flows is short because it does not depend on a change in the electric potential of the bit line but a change in the mode signal.

As described above, a short period for a current flow between the first and second potentials and the function of the electric potential converting circuit to convert the electric potential of the bit line can be kept by using at least the first to third transistors. Therefore, the number of elements and power consumption can be reduced. Accordingly, this effect is more excellent than in the technology disclosed in the Japanese Patent Application Laid-Open No. 6-12879 in which the number of elements is great.

According to the second aspect of the present invention, the following effect can be obtained. The current flows between the first and second potentials in the transient state from the different mode to the predetermined mode indicated by the mode signal. If the bit line is precharged by the fourth transistor receiving the mode signal, an operating speed of the precharge circuit can be increased so that a period for which the first to third transistors are ON together can be shortened. Consequently, the power consumption can further be reduced.

According to the third aspect of the present invention, the following effect can be obtained. More specifically, the fifth transistor is provided so that the electric potential of the precharged bit line approximates a threshold voltage of the second transistor. Consequently, an operating speed of the semiconductor integrated circuit can be increased.

The semiconductor integrated circuit in accordance with the fourth aspect of the present invention is effective in that the separation of the bit lines achieves a higher speed operation and a smaller amount of power consumption.

The semiconductor integrated circuit in accordance with the fifth aspect of the present invention has effects to be described below. Since the first transistor includes the eighth transistor for the first bit line and the ninth transistor for the second bit line, the reduction in power consumption is accomplished if the word lines connected to the first and second memory cells are connected together, for example.

The semiconductor integrated circuit in accordance with the sixth aspect of the present invention has effects to be described below. While data is being read from one of the first and second memory cells, one of the tenth transistors for the first bit line and the eleventh transistor for the second bit line is turned OFF. Thus, the electric potential converting circuit may output correct data which is read.

The semiconductor integrated circuit in accordance with the seventh aspect of the present invention has effects to be described below. The provision of the bit line potential retaining circuit permits the second transistor to be turned OFF more reliably when the data in the memory cell is at the potential at which the second transistor is turned OFF in the mode different from the predetermined mode, to prevent the first, second and twelfth transistors from being turned ON simultaneously, thereby reducing the power consumption of the electric potential converting circuit.

In order to solve the above-mentioned problem, it is an object of the present invention to provide a semiconductor integrated circuit capable of reducing power consumption in an electric potential converting circuit for converting an electric potential of a bit line.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a circuit diagram for illustrating a semiconductor integrated circuit according to a fifth preferred embodiment of the present invention.

DESCRIPTION OF THE PREFERRED EMBODIMENTS

First Preferred Embodiment

Figure 1:
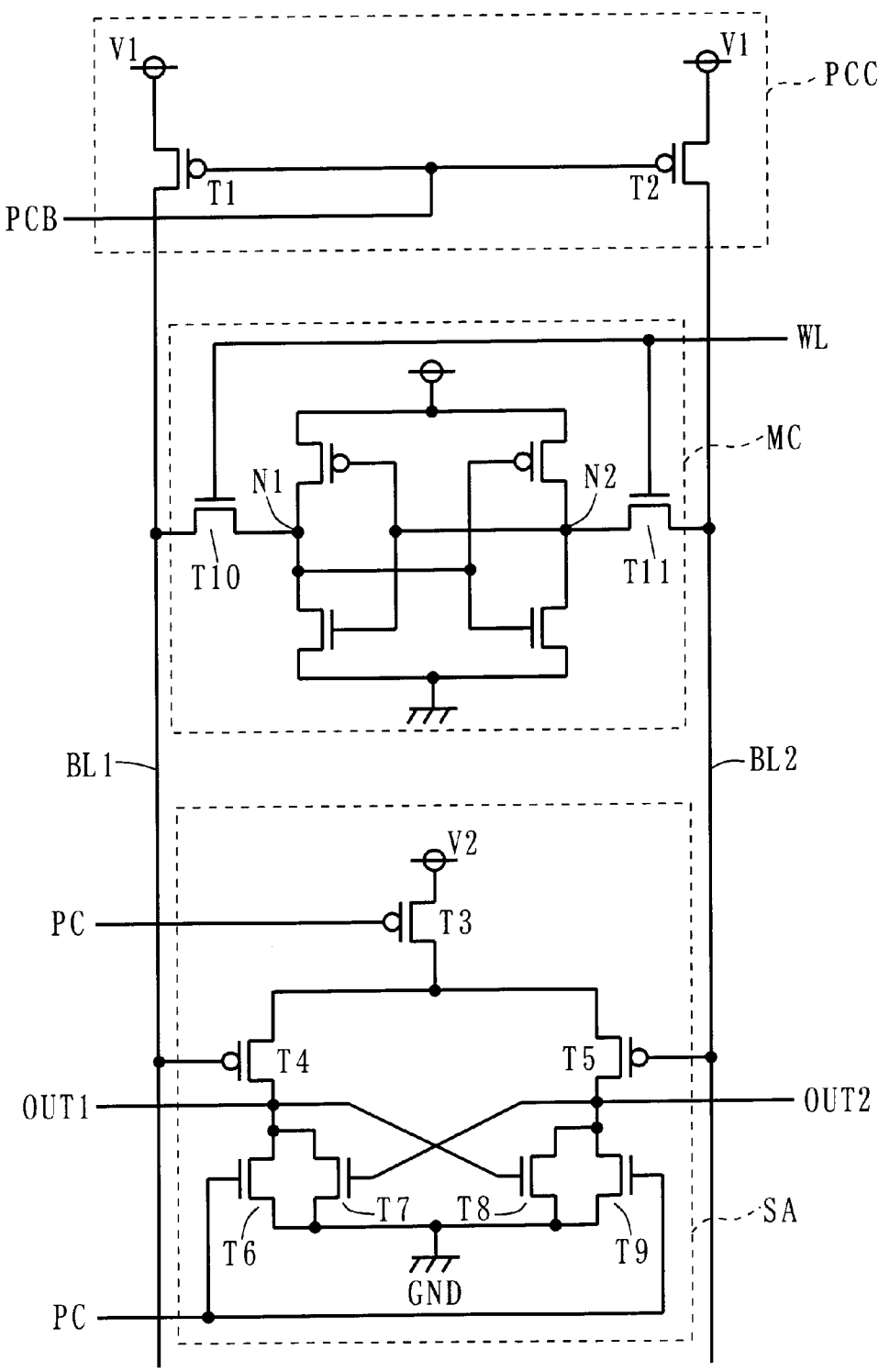
FIG. 1 is a circuit diagram for explaining a semiconductor integrated circuit according to a first preferred embodiment of the present invention.

FIG. 1 is a circuit diagram for explaining a semiconductor integrated circuit according to a first preferred embodiment of the present invention. In FIG. 1, BL1 and BL2 denote bit lines, MC denotes a memory cell connected to the bit lines BL1 and BL2, PCC denotes a precharge circuit connected to the bit lines BL1 and BL2 for precharging the bit lines BL1 and BL2 in response to a mode signal (precharge signal) PCB, and SA denotes an electric potential converting circuit (a sense amplifier) connected to the bit lines BL1 and BL2 for amplifying, converting and outputting electric potentials of the bit lines BL1 and BL2.

The precharge circuit PCC includes transistors T1 and T2. In the transistor T1, a source electrode (a first current electrode) receives a precharge potential V1, a gate electrode (a control electrode) receives the mode signal PCB, and a drain electrode (a second current electrode) is connected to the bit line BL1. In the transistor T2, a source electrode receives the precharge potential V1, a gate electrode receives the mode signal PCB, and a drain electrode is connected to the bit line BL2.

The memory cell MC includes NMOS transistors T10 and T11. Electric potentials of nodes N1 and N2 represent data, one of which is at an "H" level and the other is at an "L" level.

The electric potential converting circuit SA includes transistors T3 to T9. In the transistor T3, a source electrode receives a high potential V2, a gate electrode receives a mode signal PC, and a drain electrode is connected to respective source electrodes of the transistors T4 and T5. To an output wiring OUT1 are connected respective drain electrodes of the transistors T4, T6 and T7 and a gate electrode of the transistor T8. To an output wiring OUT2 are connected respective drain electrodes of the transistors T5, T8 and T9 and a gate electrode of the transistor T7. Respective source electrodes of the transistors T6 to T9 are connected to a ground potential GND. The bit line BL1 is connected to a gate electrode of the transistor T4. The bit line BL2 is connected to a gate electrode of the transistor T5. Respective gate electrodes of the transistors T6 and T9 receive the mode signal PC. The mode signals PC and PCB are complementary to each other.

In the first preferred embodiment, the transistors T1 to T5 are PMOS transistors, and the transistors T6 to T11 are NMOS transistors. The transistor T3 acts as a first transistor, the transistors T4 and T5 act as second transistors, the transistors T6 and T9 act as third transistors, the transistors T1 and T2 act as fourth transistors, the high potential V2 acts as a first potential, and the ground potential GND acts as a second potential.

The high potential V2 may be equal to the precharge potential V1, or they may be set to a supply (VDD) potential of the semiconductor integrated circuit.

Figure 2:
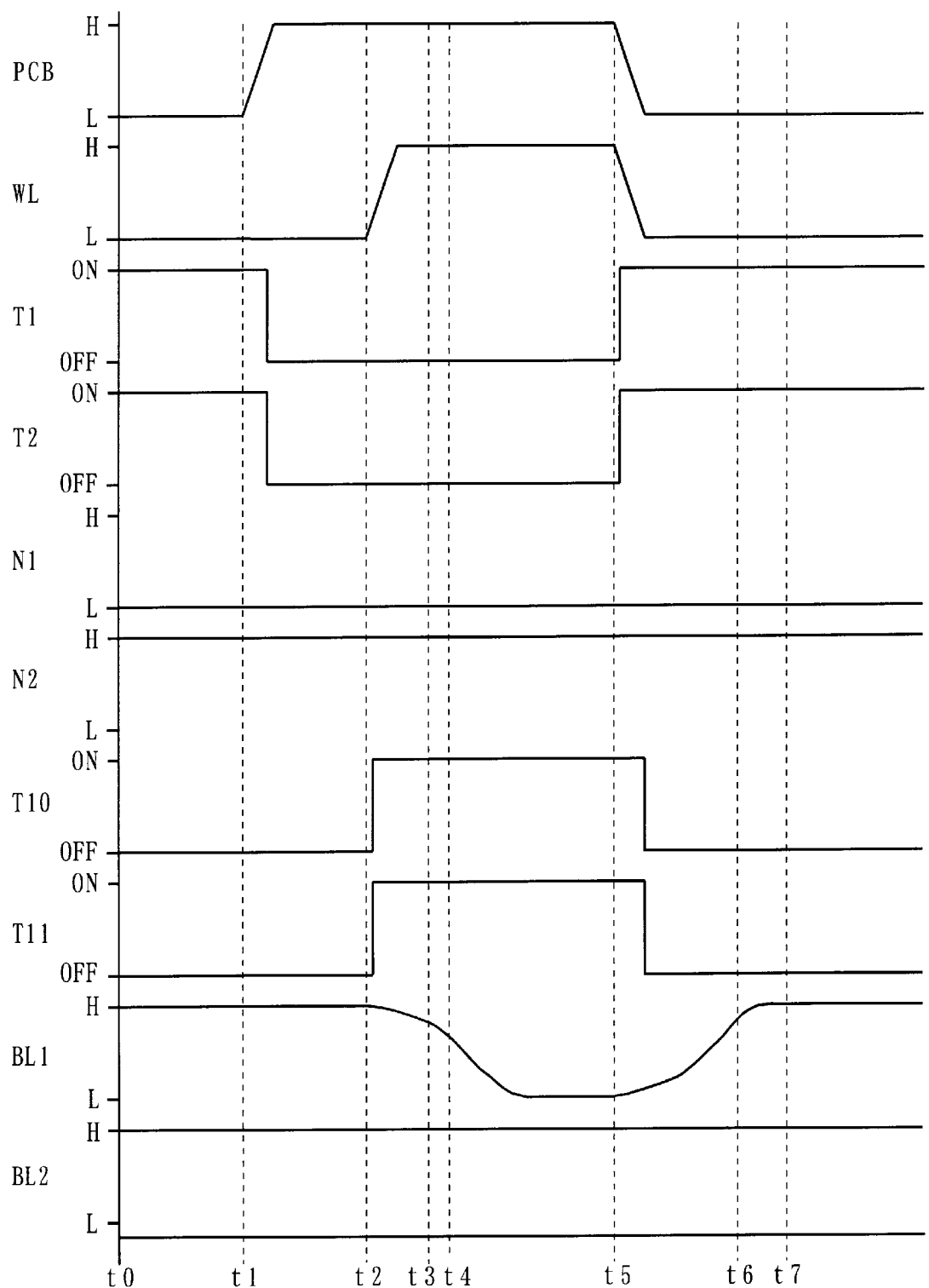
FIG. 2 is a timing chart showing operation of the semiconductor integrated circuit according to the first preferred embodiment of the present invention.
Figure 3:
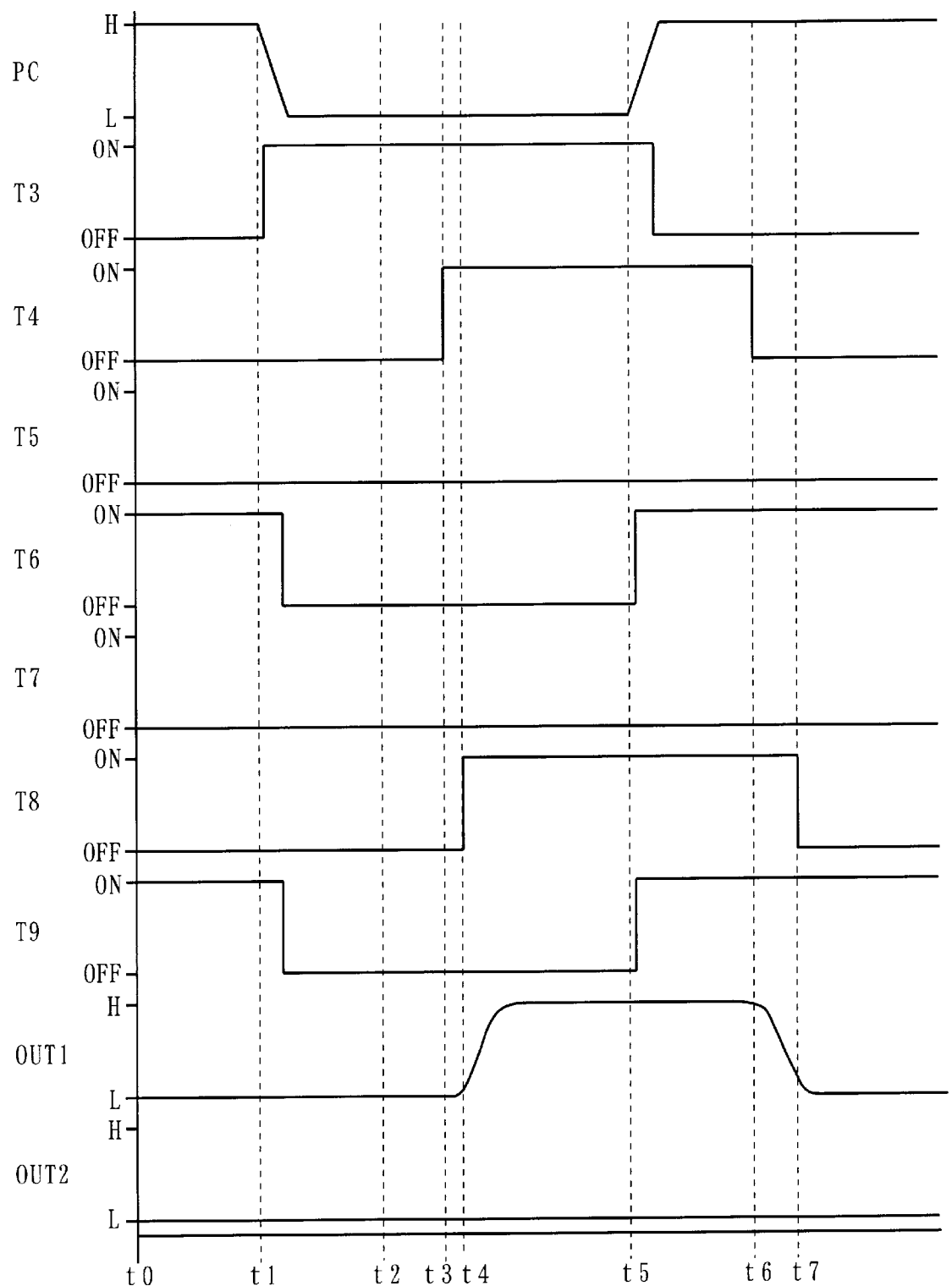
FIG. 3 is a timing chart showing the operation of the semiconductor integrated circuit according to the first preferred embodiment of the present invention.

FIGS. 2 and 3 are timing charts showing operation of the circuit in FIG. 1. A period for which the mode signal PC is falling, for example, between times t1 and t5 will be hereinafter referred to as a read mode, and other periods will be hereinafter referred to as a precharge mode.

First of all, there will be described the case where the mode signal PC, the mode signal PCB, an electric potential of a word line WL, the electric potential of the node N1, and the electric potential of the node N2 are at "H", "L", "L", "L" and "H" levels at a time t0 in an initial state.

At the time t0, the transistors T1 and T2 are ON because the mode signal PCB is at the "L" level. Since the mode signal PC is at the "H" level, the transistor T3 is OFF and the transistors T6 and T9 are ON. The transistors T10 and T11 are OFF because the electric potential of the word line WL is at the "L" level. Since the transistor T1 is ON and the transistor T10 is OFF, the electric potential of the bit line BL1 is precharged to the "H" level. Since the transistor T2 is ON and the transistor T11 is OFF, the electric potential of the bit line BL2 is precharged to the "H" level.

The transistors T4 and T5 are OFF because the electric potentials of the bit lines BL1 and BL2 are at the "H" level. Since the transistors T6 and T9 are ON, electric potentials of the output wirings OUT1 and OUT2 are precharged to the "L" level. The transistors T7 and T8 are OFF because the electric potentials of the output wirings OUT2 and OUT1 are at the "L" level.

In the above-mentioned precharge mode, the transistor T3 is OFF. Therefore, a current does not flow between the precharge potential V1 and the ground potential GND.

The read mode will be described below. The read mode is started at a time t1. At the time t1, the mode signal PC falls simultaneously with a rise in the mode signal PCB. Then, the transistors T1 and T2 are turned OFF respectively when the mode signal PCB is set to the "H" level. The transistors T3, T6 and T9 are turned ON, OFF and OFF respectively when the mode signal PC is set to the "L" level.

Although the bit lines BL1 and BL2 are released from the precharge potential V1 by turning OFF the transistors T1 and T2, they keep electric potentials at the "H" level. Accordingly, the transistors T4 and T5 are kept OFF respectively.

At a time t2, the electric potential of the word line WL rises. Then, the transistors T10 and T11 are turned ON respectively when the electric potential of the word line WL is set to the "H" level. Since the electric potential of the node N1 is at the "L" level, the electric potential of the bit line BL1 is gradually dropped. On the other hand, since the electric potential of the node N2 is at the "H" level, the electric potential of the bit line BL2 is kept at the "H" level.

At a time t3, the electric potential of the bit line BL1 is set to a threshold voltage of the transistor T4 so that the transistor T4 is turned ON. Since the transistors T3, T4, T6 and T7 are ON, ON, OFF and OFF, the electric potential of the output wiring OUT1 is raised to the "H" level.

At a time t4, the electric potential of the output wiring OUT1 is set to a threshold voltage of the transistor T8 so that the transistor T8 is turned ON. Since the transistors T5 and T8 are OFF and ON respectively, the electric potential of the output wiring OUT2 is kept at the "L" level.

In a state of transition from the precharge mode to the read mode, thus, the transistors T3, T6 and T9 instantly respond to the mode signal PC and perform ON/OFF switching operation, and one of the transistors T4 and T5 is then turned from OFF to ON. Accordingly, even if the transistors T3, T6 and T9 are transiently turned ON momentarily at the same time, a current does not flow between the precharge potential V1 and the ground potential GND because the transistors T4 and T5 are kept OFF.

Subsequently, the electric potential of the output wiring OUT1 is completely set in a stationary state at the "H" level. A circuit (not shown) which is connected to the output wirings OUT1 and OUT2 fetches, as data, the "H" level of the electric potential of the output wiring OUT1 and the "L" level of the electric potential of the output wiring OUT2.

Next, the precharge mode is performed again. The precharge mode is started at a time t5. At the time t5, the mode signal PC rises simultaneously with a fall in the mode signal PCB. Then, the transistors T1 and T2 are turned ON together when the mode signal PCB is set to the "L" level. The transistors T3, T6 and T9 are turned OFF, ON and ON respectively when the mode signal PC is set to the "H" level. At the same time that the mode signals PC and PCB are changed, the electric potential of the word line WL falls. When the electric potential of the word line WL is set to the "L" level, the transistors T10 and T11 are turned OFF together. Since the transistor T1 is ON and the transistor T10 is OFF, the bit line BL1 is precharged so that the electric potential of the bit line BL1 is gradually raised to the "H" level. On the other hand, the electric potential of the bit line BL2 is kept at the "H" level.

At a time t6, the electric potential of the bit line BL1 is set to a threshold voltage of the transistor T4 so that the transistor T4 is turned OFF. Since the transistors T4 and T6 are OFF and ON respectively, the electric potential of the output wiring OUT1 is dropped to the "L" level. At a time t7, the electric potential of the output wiring OUT1 is set to a threshold voltage of the transistor T8 so that the transistor T8 is turned OFF. The transistors T5 and T9 are OFF and ON respectively, and the electric potential of the output wiring OUT2 is kept at the "L" level.

In a state of transition from the read mode to the precharge mode, thus, the transistors T3, T6 and T9 instantly respond to the mode signal PC and perform ON/OFF switching operation, and the transistor T4 is then turned from ON to OFF. The transistor T5 is kept OFF. Accordingly, the transistors T3 and T6 are transiently turned ON momentarily at the same time, the transistor T4 is turned ON and the transistor T5 is kept OFF. Therefore, a current momentarily flows between the high potential V2 and the ground potential GND through only the transistors T3, T4 and T6. A period for which the current flows depends on a change in the mode signal PC, and does not depend on a change in the electric potential of the bit line BL1.

Since operation to be performed in the case where the electric potentials of the nodes N1 and N2 are at the "H" level and the "L" level respectively can be considered in the same manner as in the above-mentioned description because of symmetry of the circuit shown in FIG. 1, its description will be omitted.

Thus, the electric potential converting circuit SA converts the electric potentials of the bit lines BL1 and BL2 into the high potential V2 or the ground potential GND to be output to the output wirings OUT1 and OUT2.

Only in the state of transition from the read mode to the precharge mode, the current flows from the high potential V2 to the ground potential GND. Since this period does not depend on the electric potentials of the bit lines BL1 and BL2, it is shorter than in the prior art.

Furthermore, the transistors T7 and T8 act to fix the electric potentials of the output wirings OUT1 and OUT2. For example, although the output wiring OUT2 should be set into a floating state by turning OFF the transistors T5 and T9 between the times t4 and t5 shown in FIG. 3, it is fixed to the ground potential GND by action of the transistor T8. Accordingly, the transistors T7 and T8 are not always necessary for action of the electric potential converting circuit SA, that is, action to convert the electric potential of the bit line into the high potential V2 or the ground potential GND.

Effects of the first preferred embodiment are as follows. More specifically, the period for which the current flows from the high potential V2 to the ground potential GND in the electric potential converting circuit SA is shorter than in the prior art. Therefore, power consumption of the electric potential converting circuit SA can be reduced.

Figure 9:
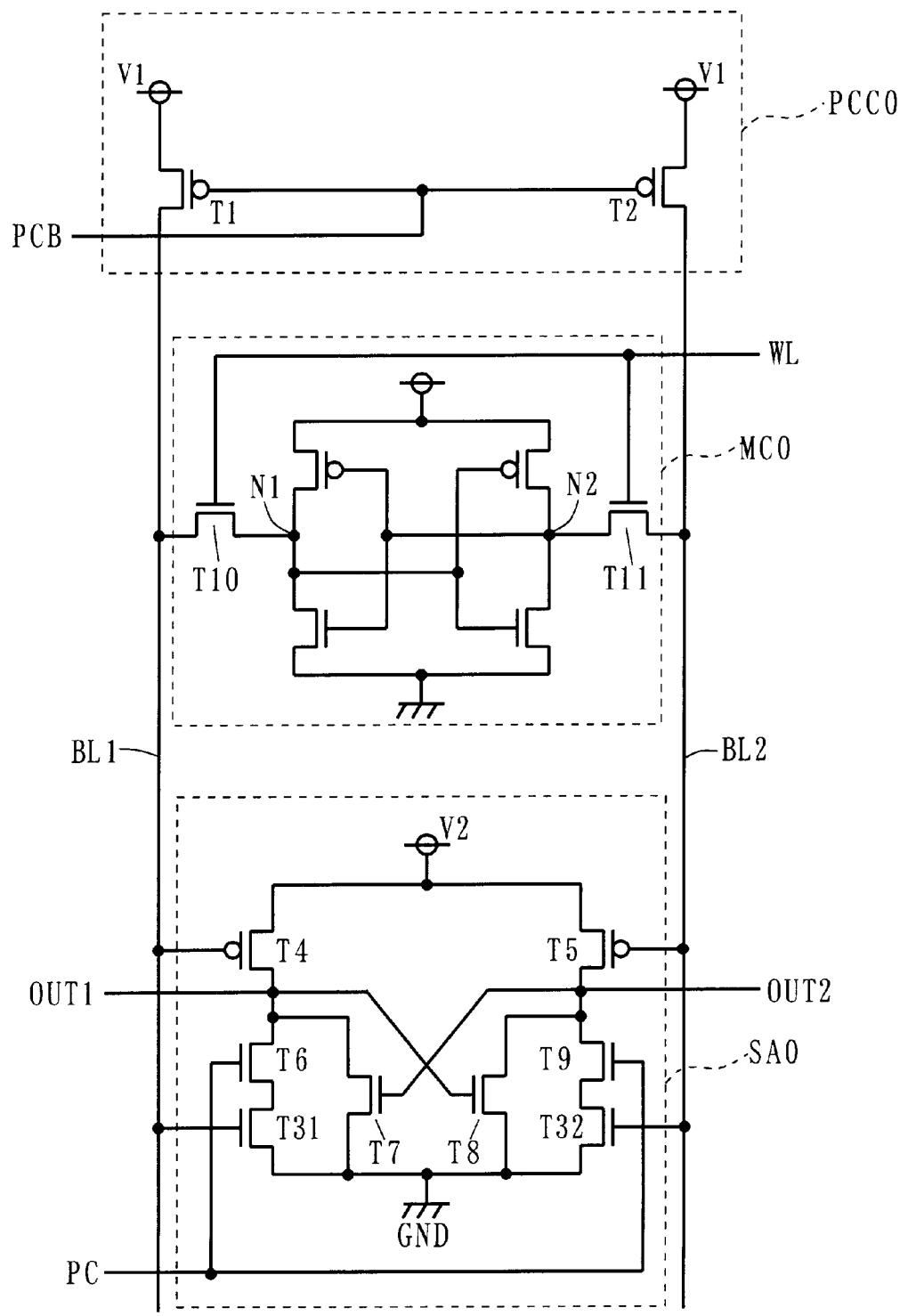
FIG. 9 is a circuit diagram showing main parts of a semiconductor integrated circuit according to the prior art.
Figure 10:
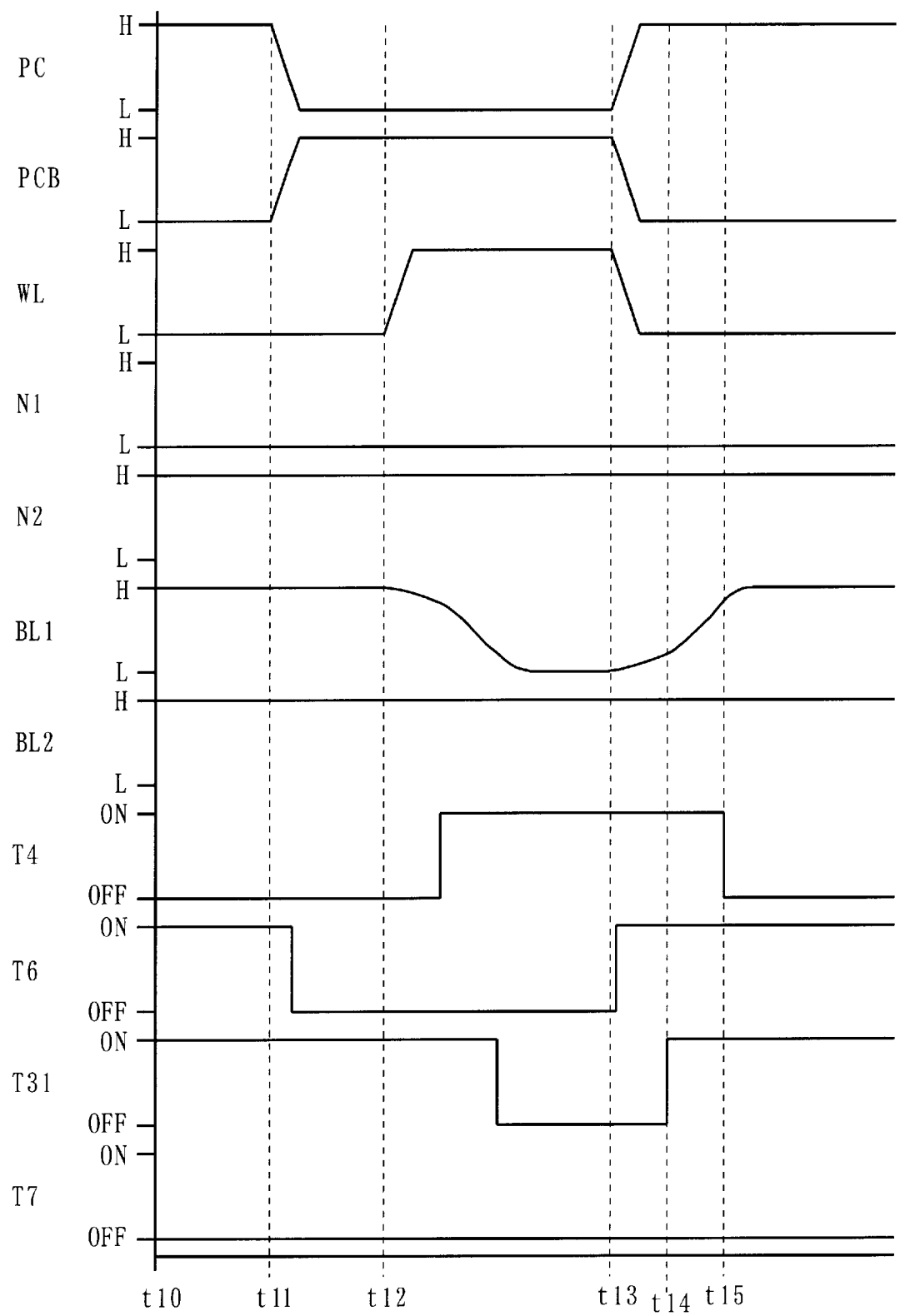
FIG. 10 is a timing chart showing operation of the semiconductor integrated circuit according to the prior art.

In the first preferred embodiment, the number of elements is smaller and a layout area can be reduced more than in the circuit shown in FIG. 9 and the technology disclosed in the Japanese Patent Application Laid-Open No. 6-12879.

The electric potential converting circuit SA includes a path for a current flowing from the high potential V2 to the ground potential GND, that is, a path formed by the transistors T3, T4 and T6 sequentially connected in series and a path formed by the transistors T3, T5 and T9 sequentially connected in series. The current does not simultaneously flow into these two paths. The reason is that the transistors T4 and T5 are not turned ON at the same time. Accordingly, the current flows from the high potential V2 to the ground potential GND through only one path. Therefore, a small quantity of the current flows. Thus, the power consumption of the electric potential converting circuit SA can be reduced.

As described above, the current flows into the electric potential converting circuit SA when the transistors T3, T6 and T9 perform the ON/OFF switching operation respectively (at the time t5 in FIGS. 3 and 6) and the transistor T4 or T5 then performs the ON/OFF switching operation (at the time t6) in the state of transition from the read mode to the precharge mode. A period from the ON/OFF switching point of the transistors T3, T6 and T9 to the ON/OFF switching point of the transistor T4 or T5 is increased or reduced depending on a variation in a manufacturing process, a capability of the transistor determined at a design stage, and the like. By increasing an operating speed of the precharge circuit PCC as much as possible, the ON/OFF switching point of the transistor T4 or T5 is caused to approach the ON/OFF switching point of the transistors T3, T6 and T9. Consequently, it is possible to manufacture a semiconductor integrated circuit in which the transistor T4 or T5 is turned OFF so that the current stops flowing into the electric potential converting circuit SA in the middle of the ON/OFF switching operation of the transistors T3, T6 and T9. Accordingly, while the precharge circuit PCC may have an internal structure which is not shown, it is desirable that the operating speed should be increased by using a simple structure having only the transistors T1 and T2.

Second Preferred Embodiment

Figure 4:
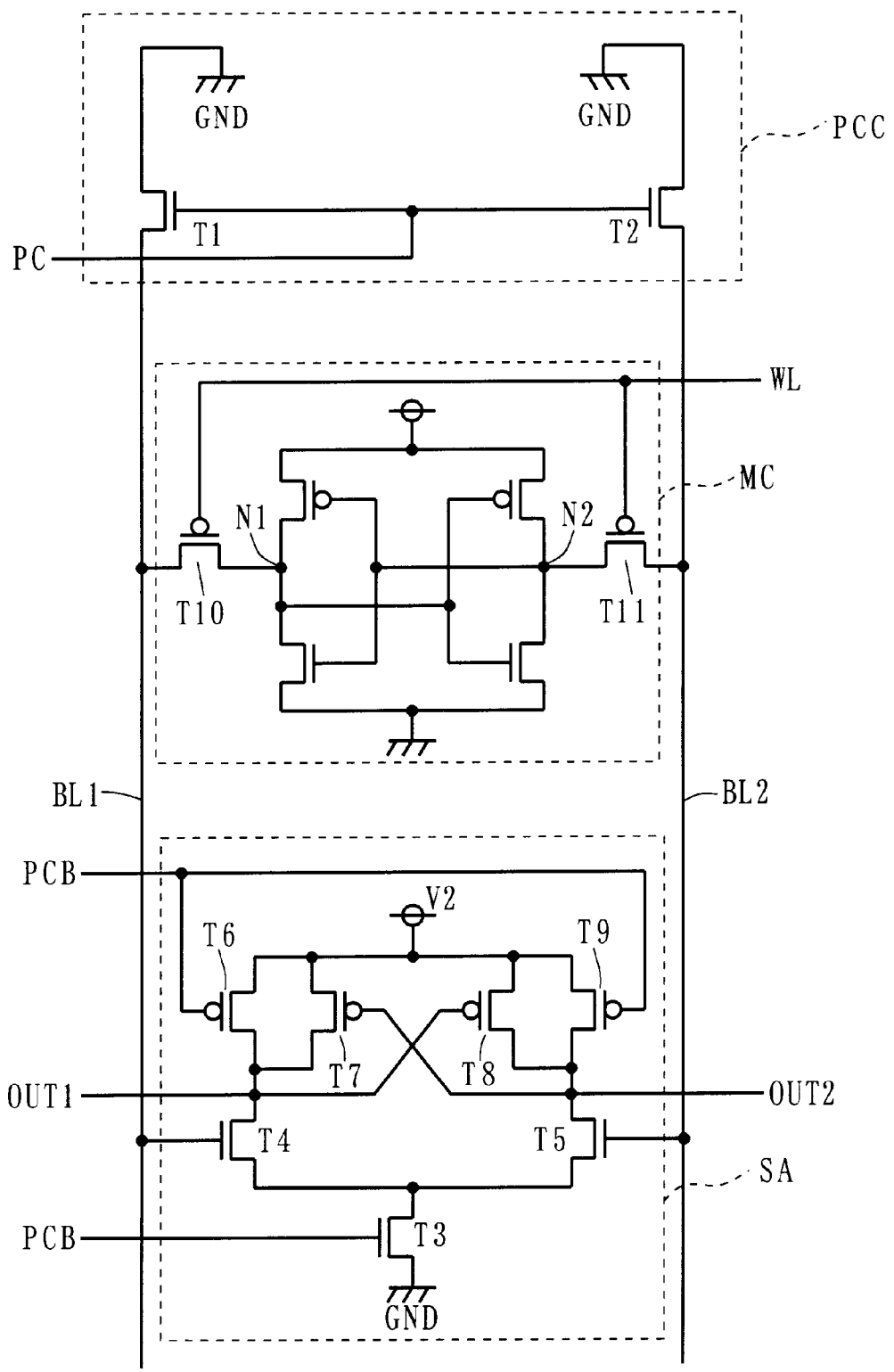
FIG. 4 is a circuit diagram for explaining a semiconductor integrated circuit according to a second preferred embodiment of the present invention.

FIG. 4 is a circuit diagram for explaining a semiconductor integrated circuit according to a second preferred embodiment of the present invention. While the circuit shown in FIG. 4 is mainly similar to the circuit shown in FIG. 1, it has an inverted polarity. In FIG. 4, T1 to T5 denote NMOS transistors, T6 to T11 denote PMOS transistors, respective source potentials of the transistors T1, T2 and T3 are set to a ground potential GND, and respective source potentials of the transistors T6, T7, T8 and T9 are set to a high potential V2.

In the second preferred embodiment, the transistor T3 acts as a first transistor, the transistors T4 and T5 act as second transistors, the transistors T6 and T9 act as third transistors, the transistors T1 and T2 act as fourth transistors, the high potential V2 acts as a second potential, and the ground potential GND acts as a first potential.

Figure 5:
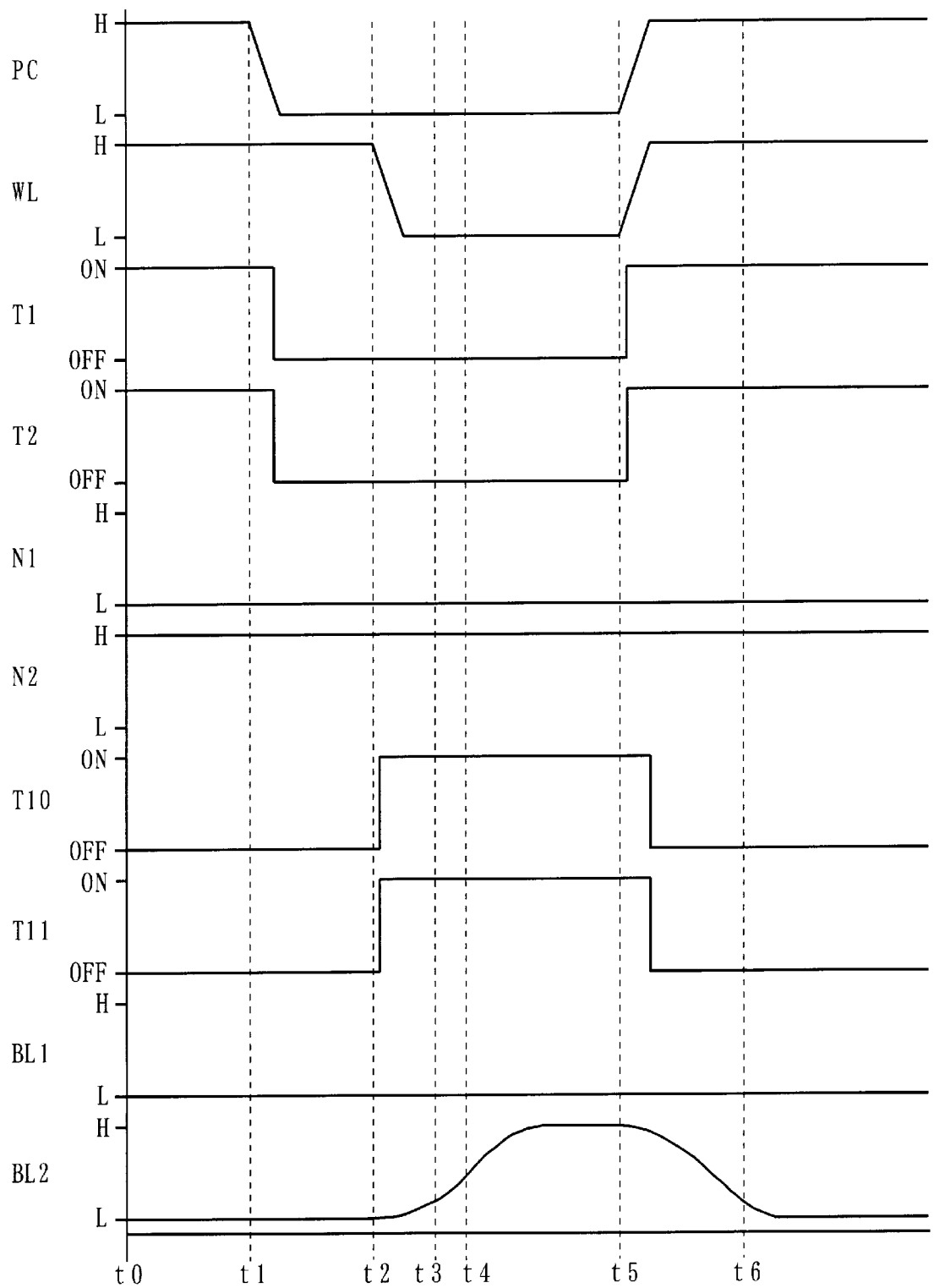
FIG. 5 is a timing chart showing operation of the semiconductor integrated circuit according to the second preferred embodiment of the present invention.
Figure 6:
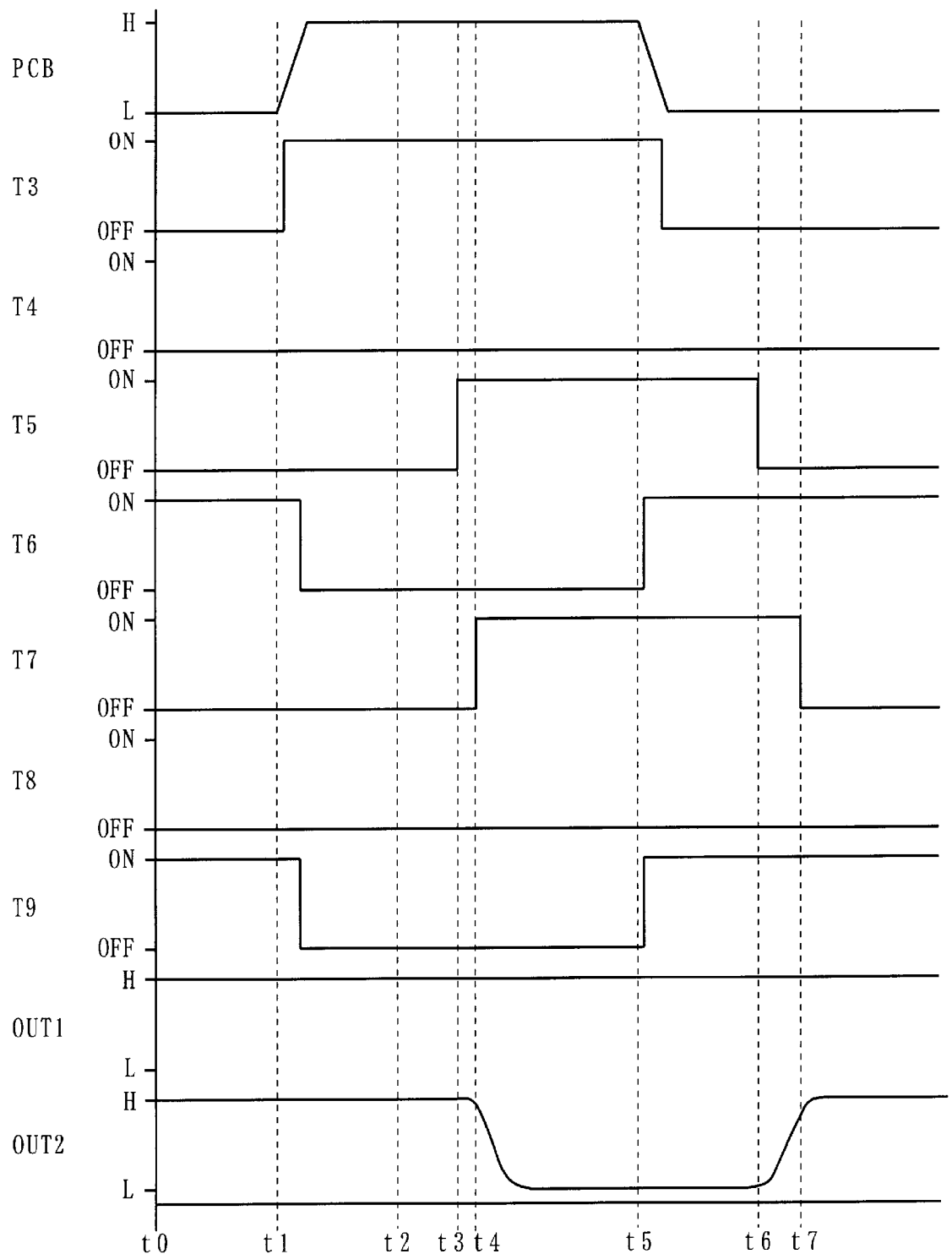
FIG. 6 is a timing chart showing the operation of the semiconductor integrated circuit according to the second preferred embodiment of the present invention.

Since operation of the circuit in FIG. 4 is shown in FIGS. 5 and 6 and can be considered in the same manner as in the description of the first preferred embodiment because of the inverted polarity, its detailed description will be omitted.

Effects of the second preferred embodiment are the same as in the first preferred embodiment.

It should be noted that, in the first and second preferred embodiments, the time t2 that the electric potential of the word line WL is changed can be identical to the time t1 that the mode signals PC and PCB are changed. In this case, a period from the time t1 to the time t2 does not exist. Therefore, an operating speed of the semiconductor integrated circuit can be increased.

Figure 7:
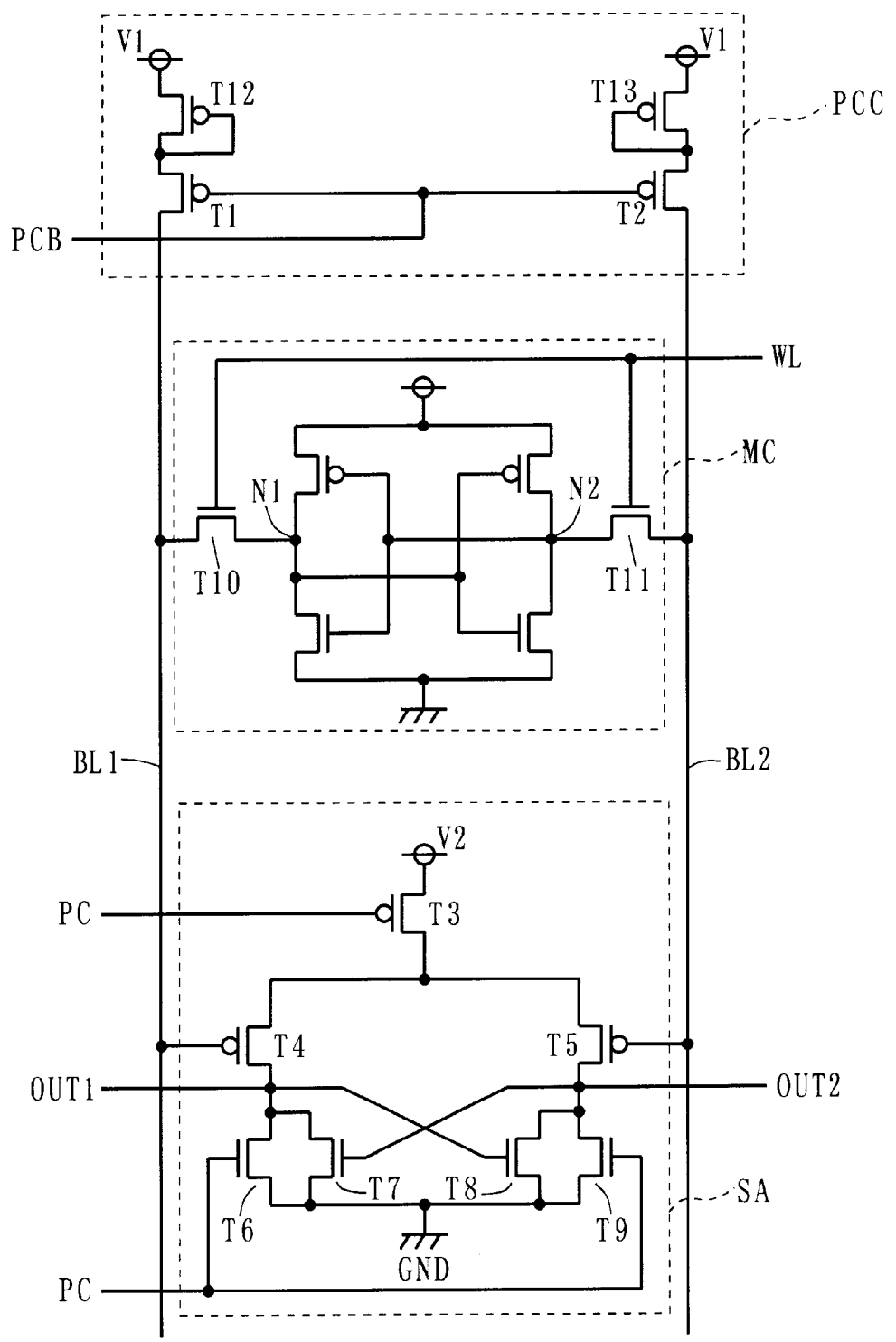
FIG. 7 is a circuit diagram showing a variant of the semiconductor integrated circuit according to the first preferred embodiment of the present invention.
Figure 8:
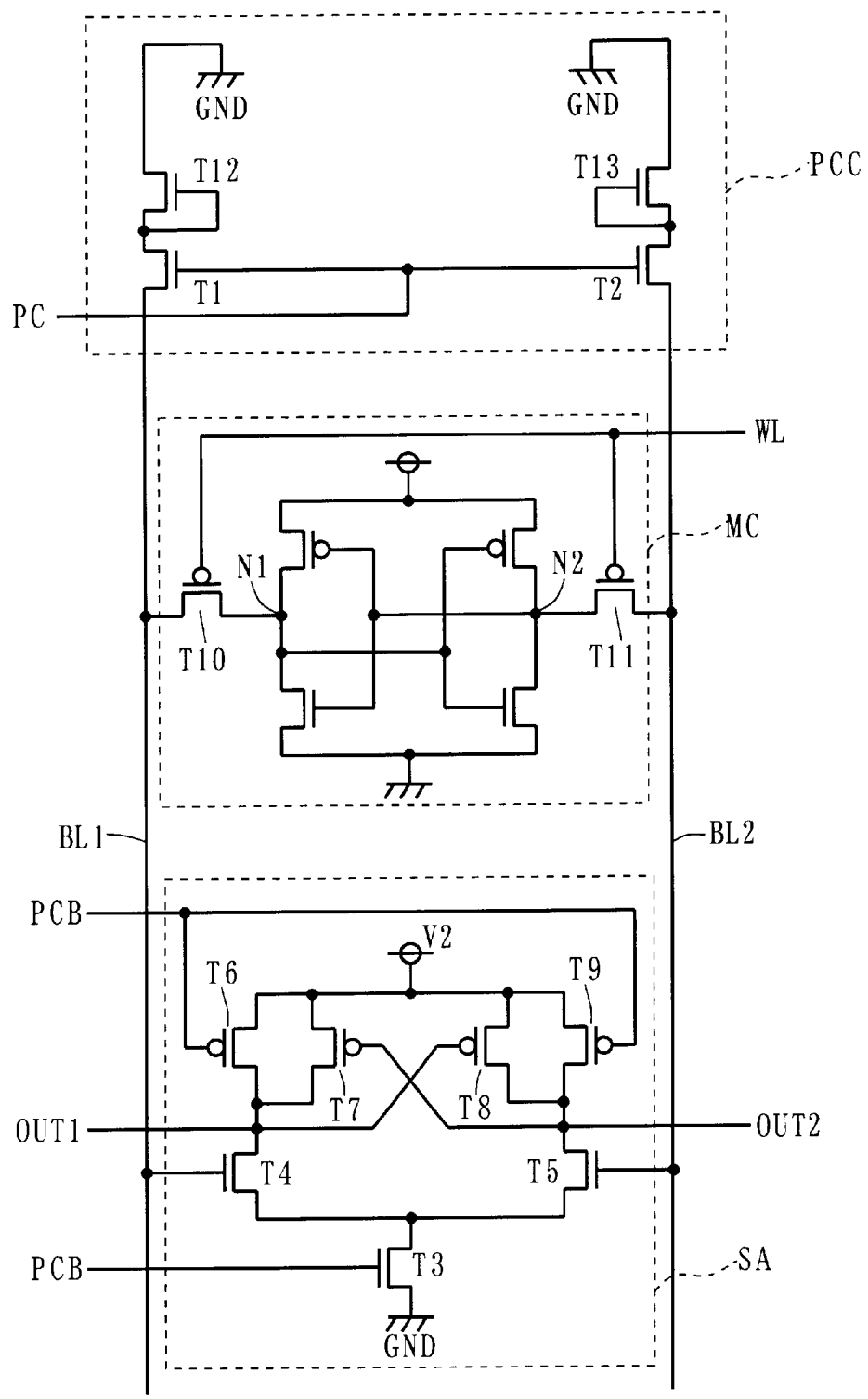
FIG. 8 is a circuit diagram showing a variant of the semiconductor integrated circuit according to the second preferred embodiment of the present invention.

Further, FIGS. 7 and 8 are circuit diagrams showing variants of the semiconductor integrated circuits according to the first and second preferred embodiments of the present invention, respectively. In the circuits shown in FIGS. 7 and 8, transistors T12 and T13 acting as fifth transistors are diode-connected between a precharge potential V1 and transistors T1 and T2. Since the transistors T12 and T13 are provided, electric potentials of bit lines BL1 and BL2 are caused to approximate threshold voltages of transistors T4 and T5 at the time t2 that the electric potential of the word line WL is changed. Consequently, a period from the time t2 to a time t3 that the transistor T4 or T5 is turned ON becomes short. Thus, the operating speed of the semiconductor integrated circuit can be increased.

Third Preferred Embodiment

Figure 11:
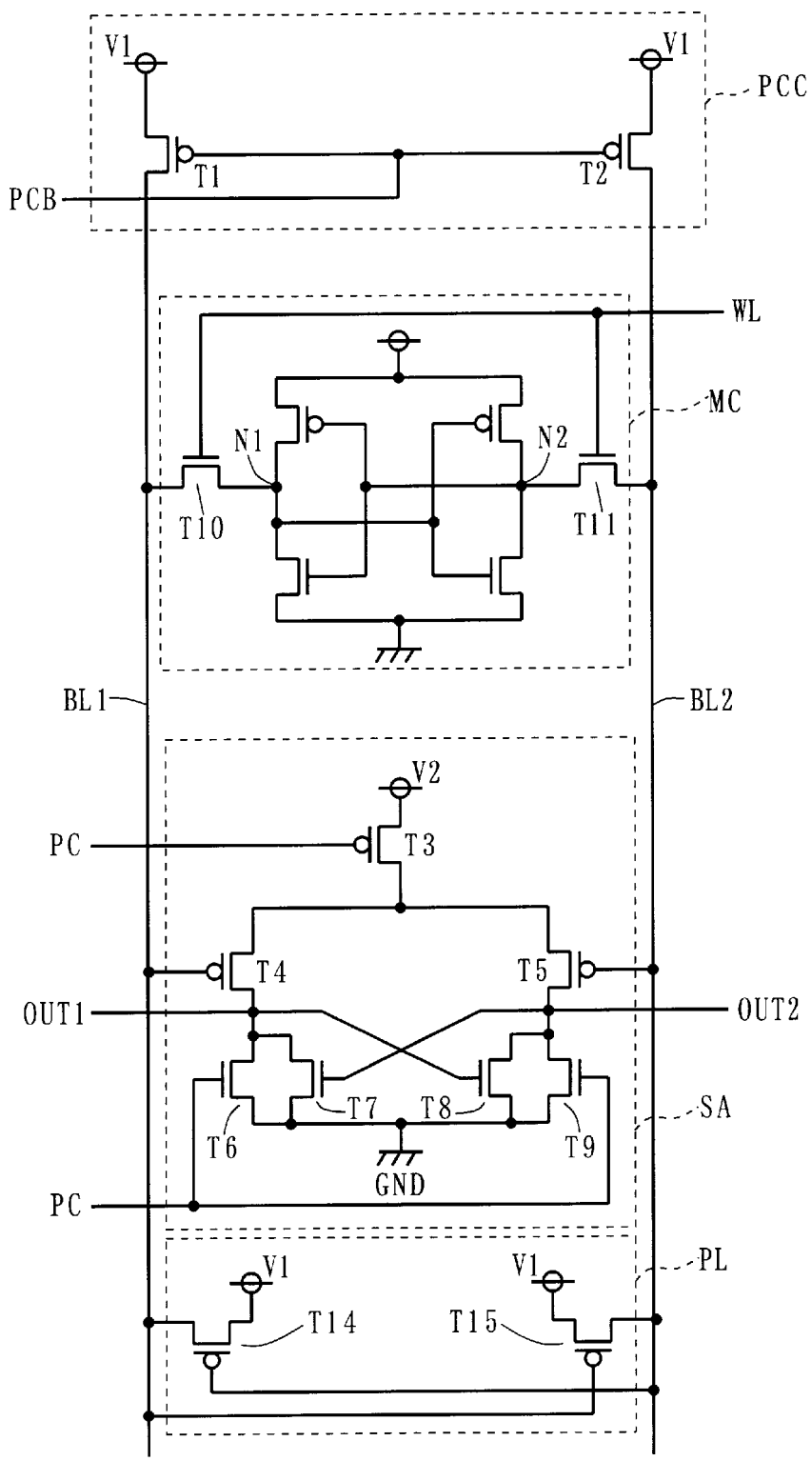
FIG. 11 is a circuit diagram for illustrating a semiconductor integrated circuit according to a third preferred embodiment of the present invention.

FIG. 11 is a circuit diagram for illustrating the semiconductor integrated circuit according to a third preferred embodiment of the present invention. In FIG. 11, the reference character PL designates a bit line potential retaining circuit. Other elements of FIG. 11 are similar to those of FIG. 1.

The bit line potential retaining circuit PL comprises PMOS transistors T14 and T15 as shown in FIG. 11. The transistor T14 has a source electrode receiving the precharge potential V1, a gate electrode connected to the bit line BL2, and a drain electrode connected to the bit line BL1. The transistor T15 has a source electrode receiving the precharge potential V1, a gate electrode connected to the bit line BL1, and a drain electrode connected to the bit line BL2. The transistors T7 and T8 serves as a twelfth transistor.

Operation will be described with reference to FIGS. 2 and 3. At the time t0, the potentials of the bit lines BL1 and BL2 are both at the "H" level as described in the first preferred embodiment. Then, the transistors T14 and T15 are both OFF.

Thereafter, at the time t1, the read mode is initiated and both of the transistors T1 and T2 are turned OFF. At the time t2, the potential of the word line WL rises and both of the transistors T10 and T11 are turned ON. Then, the bit line BL1 is connected to the node N1 which is at the "L" level, and the bit line BL2 is connected to the node N2 which is at the "H" level. The potential of the bit line BL1 falls gradually, and when the potential of the bit line BL1 reaches the threshold voltage of the transistor T15, the transistor T15 is turned ON at the time t3 in the same manner as the transistor T4. This causes the bit line BL2 to be connected to the precharge potential V1 through the transistor T15. Subsequently, the transistor T15 is turned OFF at the time t6 in the same manner as the transistor T4.

Described above is the operation in the case where the data at the node N2 is at the "H" level, or a potential at which the transistor T5 is turned OFF in the read mode. Conversely, when the data at the node N2 is at the "L" level, or a potential at which the transistor T5 is turned ON, the bit line potential retaining circuit PL does not connect the bit line BL2 through the transistor T15 to the precharge potential V1.

In the read mode, the transistor T8 is turned ON so as to fix the potential of the output wiring OUT2 at the "L" level when the data at the node N2 is at the potential (at the "H" level) at which the transistor T5 is turned OFF, and is turned OFF when it is not. In the read mode, the transistor T7 is also turned ON so as to fix the potential of the output wiring OUT1 at the "L" level when the data at the node N1 is at a potential (at the "H" level) at which the transistor T4 is turned OFF, and is turned OFF when it is not.

The third preferred embodiment has effects to be described below. In the circuit of the first preferred embodiment shown in FIG. 1, the bit line BL2 is released from the precharge potential V1 between about the time t2 and about the time t5, and is connected to the node N2 at the "H" level through the transistor T11. However, there is a likelihood that the potential of the bit line BL2 falls to the "L" level to turn ON the transistor T5. For example, if the back gate effect of the transistor T11 makes it difficult to transmit the "H" level potential at the node N2 to the bit line BL2, a leak current flowing out of the bit line BL2 decreases the potential of the bit line BL2 to cause the transistor T5 to conduct lightly. Additionally, in the circuit shown in FIG. 7, since the potential of the bit line BL2 is already close to the threshold voltage of the transistor T5 at the time t2, the transistor T5 is easy to conduct. Thus, in some cases, the transistors T3, T5 and T8 are simultaneously turned ON between the time t4 and about the time t5 to cause current to flow through the transistors T3, T5 and T8 from the high potential V2 to the ground potential GND.

In the circuit shown in FIG. 11, on the other hand, the bit line BL2 is connected through the transistor T15 to the precharge potential V1 between the times t3 and t6 to hold the transistor T5 in the OFF state. Thus, between the time t4 and about the time t5, the transistors T3, T5 and T8 are prevented from being turned ON simultaneously, and no current flows from the high potential V2 to the ground potential GND. This allows further reduction in power consumption of the electric potential converting circuit SA.

In this manner, the bit line potential retaining circuit PL, although not limited to that in the circuit shown in FIG. 11, should be adapted such that whether or not to connect the bit line (BL1, BL2) to the potential (V1) at which the second transistor (T4, T5) is turned OFF depends in the read mode upon whether or not the data in the memory cell MC is at the "H" level, or the potential at which the second transistor is turned OFF. Such an arrangement permits the second transistor to be turned OFF more reliably when the data in the memory cell MC is at the potential at which the second transistor is turned OFF in the read mode, to prevent the first, second and twelfth transistors from being turned ON simultaneously, thereby reducing the power consumption of the electric potential converting circuit SA.

The bit line potential retaining circuit PL may be readily implemented using the arrangement shown in FIG. 11.

Further, although the third preferred embodiment is shown in FIG. 11 as applied to the circuit shown in FIG. 1, the third preferred embodiment may be applied to other contents described in the first and second preferred embodiments.

Fourth Preferred Embodiment

Figure 12:
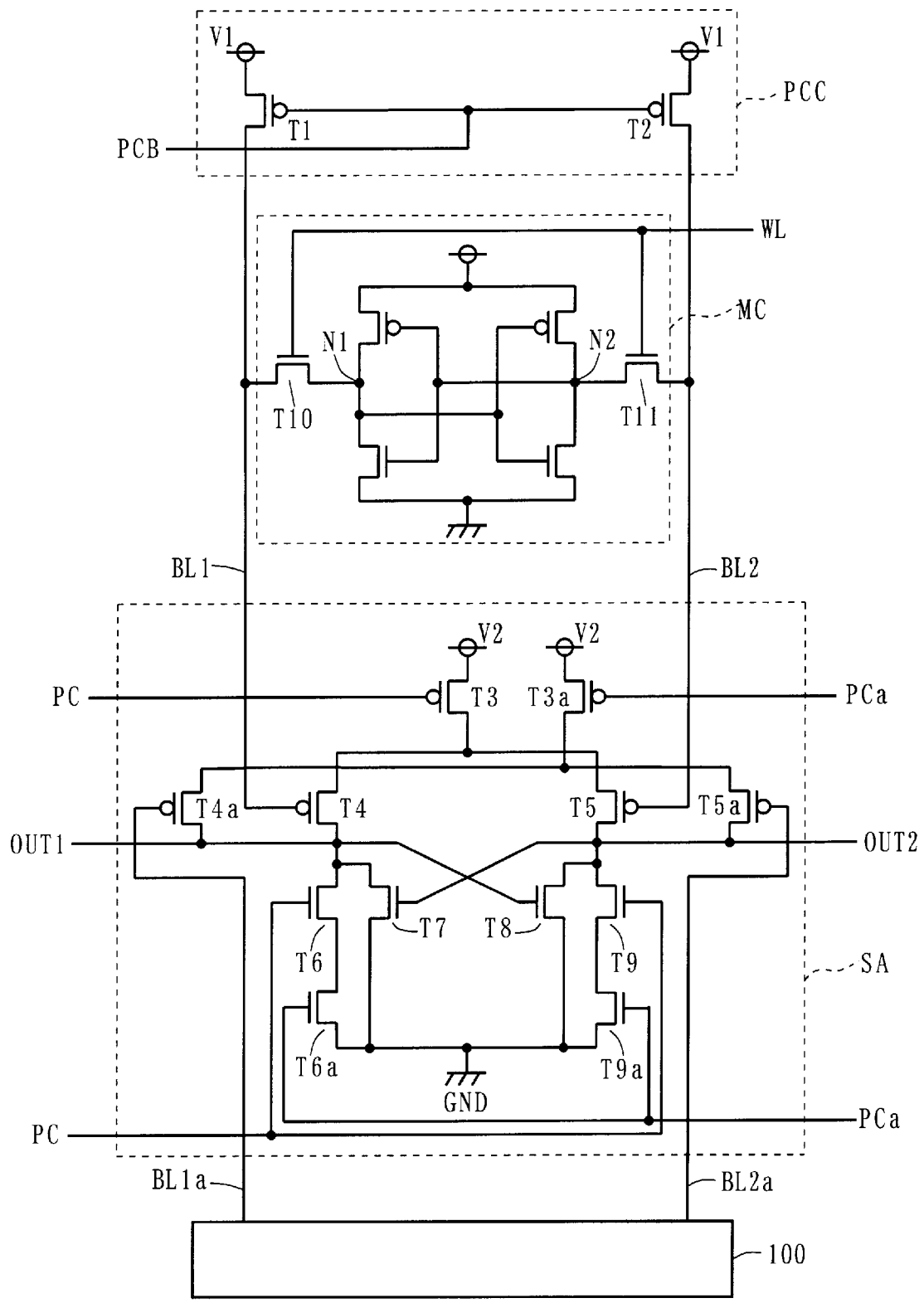
FIGS. 12 and 13 are circuit diagrams for illustrating a semiconductor integrated circuit according to a fourth preferred embodiment of the present invention.
Figure 13:
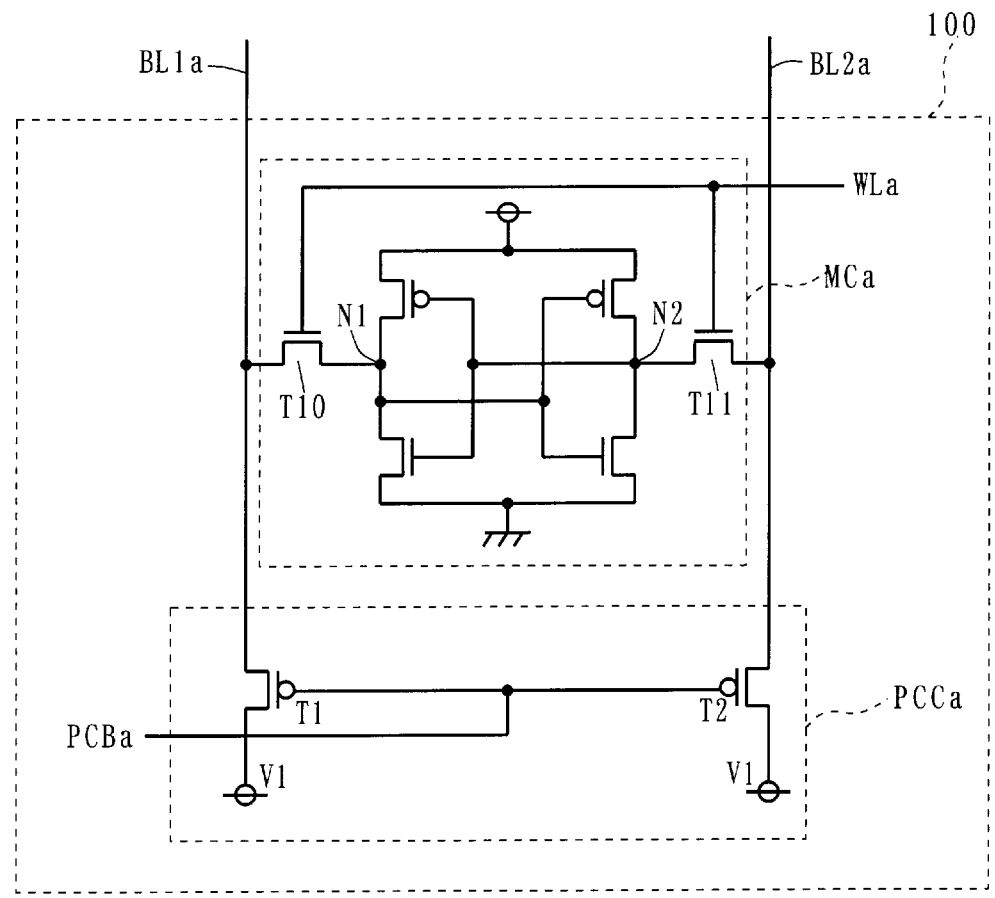

FIGS. 12 and 13 are circuit diagrams for illustrating the semiconductor integrated circuit according to a fourth preferred embodiment of the present invention. FIG. 13 shows the internal construction of a circuit 100 shown in FIG. 12. In FIGS. 12 and 13, the reference characters BL1a and BL2a designate bit lines separated from the bit lines BL1 and BL2, respectively; MCa designates a memory cell connected to the bit lines BL1a and BL2a; and PCCa designates a precharge circuit connected to the bit lines BL1a and BL2a for precharging the bit lines BL1a and BL2a in response to a mode signal PCBa. Other elements of FIGS. 12 and 13 are similar to those of the first preferred embodiment.

The precharge circuit PCCa is similar in construction to the precharge circuit PCC. Specifically, the precharge circuit PCCa comprises a transistor T1 having a source electrode receiving the precharge potential V1, a gate electrode receiving the mode signal PCBa, and a drain electrode connected to the bit line BL1a, and a transistor T2 having a source electrode receiving the precharge potential V1, a gate electrode receiving the mode signal PCBa, and a drain electrode connected to the bit line BL2a.

The memory cell MCa is similar in construction to the memory cell MC. Specifically, the memory cell MCa comprises NMOS transistors T10 and T11, and nodes N1 and N2. The potentials at the nodes N1 and N2 represent data, one of which is at the "H" level, with the other at the "L" level.

The electric potential converting circuit SA further comprises transistors T3a, T4a, T5a, T6a and T9a. The transistor T3a has a source electrode receiving the high potential V2, a gate electrode receiving a mode signal PCa, and a drain electrode connected to the source electrodes of the transistors T4a and T5a. The drain electrode of the transistor T4a is connected also to the output wiring OUT1. The drain electrode of the transistor T5a is connected also to the output wiring OUT2. The transistor T4a has a gate electrode connected to the bit line BL1a. The transistor T5a has a gate electrode connected to the bit line BL2a. The transistor T6a is connected between the transistor T6 and the ground potential GND. The transistor T6a has a source electrode connected to the ground potential GND, a drain electrode connected to the source electrode of the transistor T6, and a gate electrode receiving the mode signal PCa. The transistor T9a is connected between the transistor T9 and the ground potential GND. The transistor T9a has a source electrode connected to the ground potential GND, a drain electrode connected to the source electrode of the transistor T9, and a gate electrode receiving the mode signal PCa.

Other arrangements of the circuit shown in FIGS. 12 and 13 are similar to those of FIG. 1.

In FIGS. 12 and 13, the bit lines BL1 and BL2 serve as a first bit line, and the bit lines BL1a and BL2a serve as a second bit line. The memory cell MC serves as a first memory cell, and the memory cell MCa serves as a second memory cell. The transistors T3 and T3a serve as a first transistor. The transistors T4 and T4a are connected in parallel between the first transistor and the third transistor T6. The transistor T4 serves as a sixth transistor for the first bit line, and the transistor T4a serves as a seventh transistor for the second bit line. The transistors T5 and T5a are connected in parallel between the first transistor and the third transistor T9. The transistor T5 serves as the sixth transistor for the first bit line, and the transistor T5a serves as the seventh transistor for the second bit line. The precharge circuit PCC serves as a first precharge circuit, and the precharge circuit PCCa serves as a second precharge circuit. The mode in which the bit lines BL1 and BL2 are precharged to the potentials at which the transistors T4 and T5 are turned OFF serves as a first predetermined mode. The mode in which the bit lines BL1a and BL2a are precharged to the potentials at which the transistors T4a and T5a are turned OFF serves as a second predetermined mode.

Furthermore, in FIGS. 12 and 13, the transistor T3 serves as an eighth transistor for the first bit line, and the transistor T3a serves as a ninth transistor for the second bit line. The transistors T6 and T9 serve as a tenth transistor for the first bit line, and the transistors T6a and T9a serve as an eleventh transistor for the second bit line.

Operation will be described below. For the read operation of data from the memory cell MC to the output wirings OUT1 and OUT2, the mode signal PCa is initially set to the "H" level to prevent the high potential V2 from influencing the output wirings OUT1 and OUT2 through the transistors T3a, T4a and T5a. That is, the transistors T3a, T4a and T5a are enabled. This renders the electric potential converting circuit SA of FIG. 12 equivalent to that of FIG. 1. In this state, the mode signals PC and PCB are placed into the read mode, that is, set to the "L" and "H" levels respectively, and thereafter the potential of the word line WL is set to the "H" level, whereby the transistors T3, T4, T5, T7 and T8 can read data from the memory cell MC to the output wirings OUT1 and OUT2 as in the first preferred embodiment.

For the read operation of data from the memory cell MCa to the output wirings OUT1 and OUT2, the mode signal PC is initially set to the "H" level to prevent the high potential V2 from influencing the output wirings OUT1 and OUT2 through the transistors T3, T4 and T5. That is, the transistors T3, T4 and T5 are enabled. In this state, the mode signals PCa and PCBa are placed into the read mode, that is, set to the "L" and "H" levels respectively, and thereafter the potential of a word line WLa is set to the "H" level, whereby the transistors T3a, T4a, T5a, T7 and T8 can read data from the memory cell MCa to the output wirings OUT1 and OUT2.

In the precharge mode wherein no data is read from the memory cells MC and MCa, both of the mode signals PCB and PCBa are set to the "L" level and both of the mode signals PC and PCa are set to the "H" level, whereby no current flows from the high potential V2 to the ground potential GND in the electric potential converting circuit SA.

While data is being read from one of the memory cells MC and MCa, one of the mode signals PC and PCa is at the "L" level, and one of the transistors T6 and T6a and one of the transistors T9 and T9a are OFF. Then, the transistors T6, T6a, T9 and T9a do not reset the potentials of the output wirings OUT1 and OUT2 to the "L" level. Thus, correct data which is read is latched at the output wirings OUT1 and OUT2.

Although the word line WLa is shown in FIGS. 12 and 13 as not connected to the word line WL, the word line WLa may be connected to the word line WL. Further, although the line through which the precharge signal PCB propagates is shown in FIGS. 12 and 13 as not connected to the line through which the precharge signal PCB propagates, the former line may be connected to the latter line.

Figure 14:
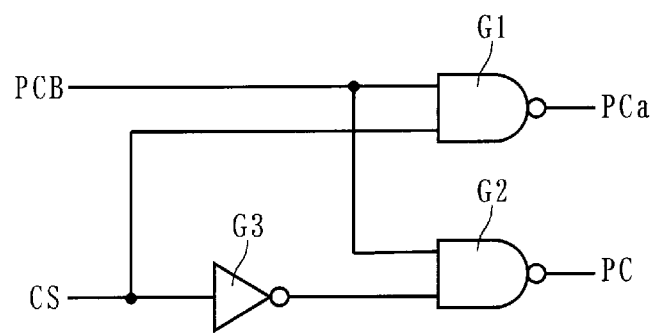
FIG. 14 is a circuit diagram of a circuit for generating precharge signals according to the fourth preferred embodiment of the present invention.

The number of columns is two when the word line WLa is connected to the word line WL and the line through which the precharge signal PCBa propagates is connected to the line through which the precharge signal PCB propagates. In this case, for example, as shown in FIG. 14, a column selection signal CS for selecting one of the two columns, the precharge signal PCB, NAND circuits G1 and G2 and an inverter G3 may be used to generate the precharge signals PC and PCa.

Although shown in FIGS. 12 and 13 as applied to the circuit of FIG. 1, the fourth preferred embodiment may be applied to other contents described in the first and second preferred embodiments. Furthermore, although two pairs of bit lines, that is, the pair of bit lines BL1 and BL2 and the pair of bit lines BL1a and BL2a are shown in FIGS. 12 and 13 as connected to the single electric potential converting circuit SA, three or more pairs of bit lines may be connected to the single electric potential converting circuit SA.

The transistors T6 and T6a are required to be connected in series between the connecting point of the transistors T4a and T4 and the ground potential GND, and may be interchanged with each other. The transistors T9 and T9a may also be interchanged with each other.

The fourth preferred embodiment has effects, similar to those of the first preferred embodiment, in that a shorter period of time for which current flows from the high potential V2 in the electric potential converting circuit SA to the ground potential GND provides the reduced power consumption of the electric potential converting circuit SA.

Additionally, the separation of the bit lines BL1a and BL2a from the bit lines BL1 and BL2 decreases the capacitances of the bit lines BL1, BL2, BL1a and BL2a to achieve a higher speed operation and a smaller amount of power consumption.

Furthermore, the use of the single electric potential converting circuit SA for reading data from both of the memory cells MC and MCa reduces a layout area.

Fifth Preferred Embodiment

FIG. 15 is a circuit diagram for illustrating the semiconductor integrated circuit according to a fifth preferred embodiment of the present invention. The circuit of FIG. 15 is provided by eliminating the transistors T3a, T6a and T9a from the circuit shown in FIGS. 12 and 13.

In the electric potential converting circuit SA shown in FIG. 15, the drain electrode of the transistor T3 is connected to the source electrodes of the transistors T4, T4a, T5 and T5a. The source electrode of the transistor T6 is connected to the ground potential GND. The source electrode of the transistor T9 is connected to the ground potential GND. Other elements of FIG. 15 are similar to those of the circuit shown in FIGS. 12 and 13.

Operation will be described below. In the precharge mode wherein no data is read from the memory cells MC and MCa, both of the mode signals PCB and PCBa are set to the "L" level, the mode signal PC is set to the "H" level, and both of the word lines WL and WLa are set to the "L" level. This causes the potentials of all the bit lines BL1, BL2, BL1a and BL2a to be precharged to the "H" level, and the transistors T3, T4, T4a, T5 and T5a are all turned OFF. Then, no current flows from the high potential V2 to the ground potential GND in the electric potential converting circuit SA.

Next, for the read operation of data from the memory cell MC to the output wirings OUT1 and OUT2, the precharge signal PCBa and the potential of the word line WLa are both held at the "L" level to maintain the transistors T4a and T5a in the OFF state. That is, the transistors T4a and T5a are held enabled. This renders the electric potential converting circuit SA of FIG. 15 equivalent to that of FIG. 1. With this state maintained, the mode signals PC and PCB are placed into the read mode, that is, set to the "L" and "H" levels respectively, and thereafter the potential of the word line WL is set to the "H" level, whereby the transistors T3, T4, T5, T7 and T8 can read data from the memory cell MC to the output wirings OUT1 and OUT2 as in the first preferred embodiment.

For the read operation of data from the memory cell MCa to the output wirings OUT1 and OUT2, the precharge signal PCB and the potential of the word line WL are both held at the "L" level to maintain the transistors T4 and T5 in the OFF state. That is, the transistors T4 and T5 are held enabled. With this state maintained, the mode signals PC and PCBa are placed into the read mode, that is, set to the "L" and "H" levels respectively, and thereafter the potential of the word line WLa is set to the "H" level, whereby the transistors T3, T4a, T5a, T7 and T8 can read data from the memory cell MCa to the output wirings OUT1 and OUT2.

The effects of the fifth preferred embodiment is the reduction in layout area because of the elimination of the transistors, in addition to the effects of the fourth preferred embodiment.

Although shown in FIG. 15 as applied to the circuit shown in FIGS. 12 and 13, the fifth preferred embodiment may be applied to other contents described in the fourth preferred embodiment.

Sixth Preferred Embodiment

Figure 16:
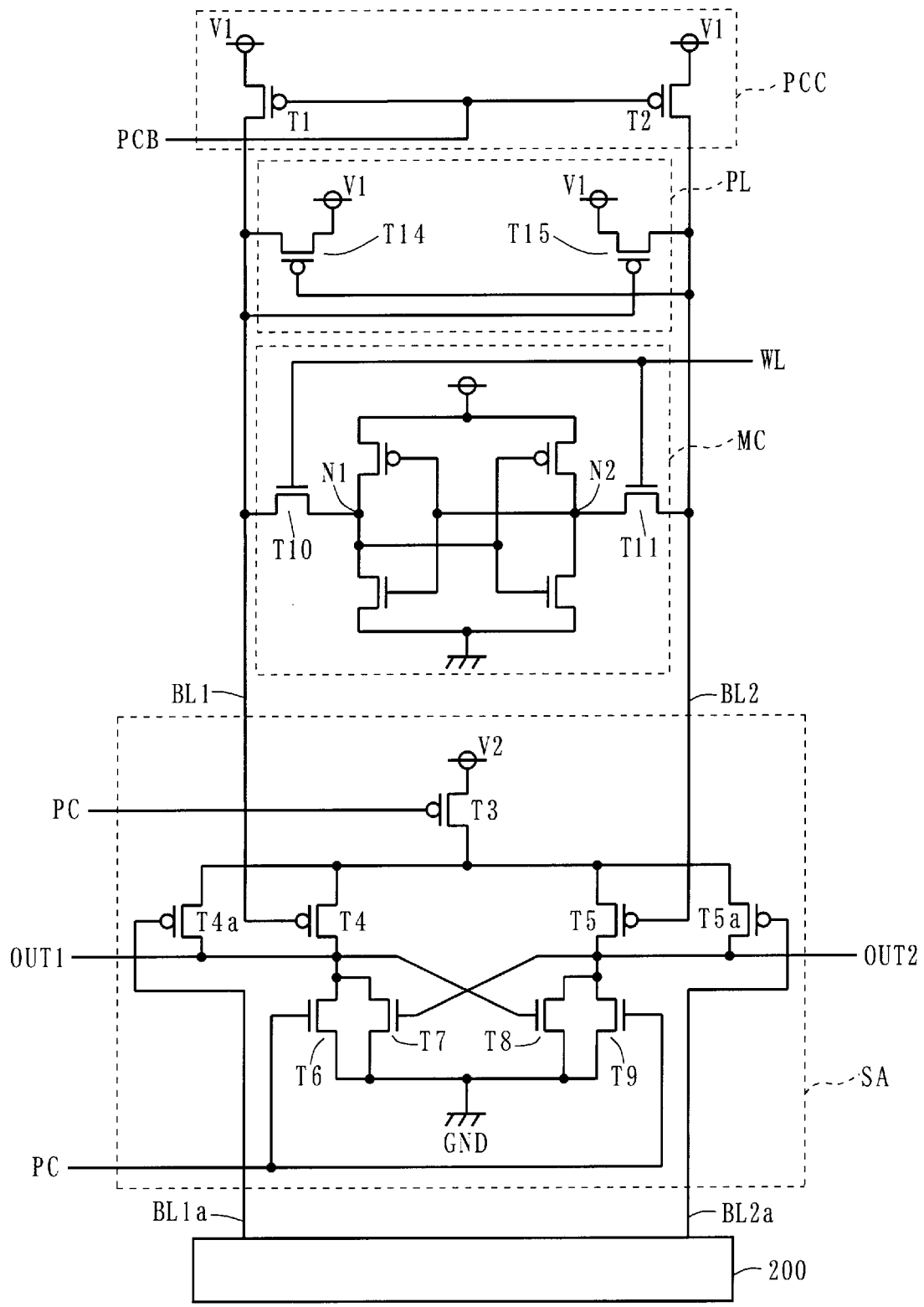
FIGS. 16 and 17 are circuit diagrams for illustrating a semiconductor integrated circuit according to a sixth preferred embodiment of the present invention.
Figure 17:
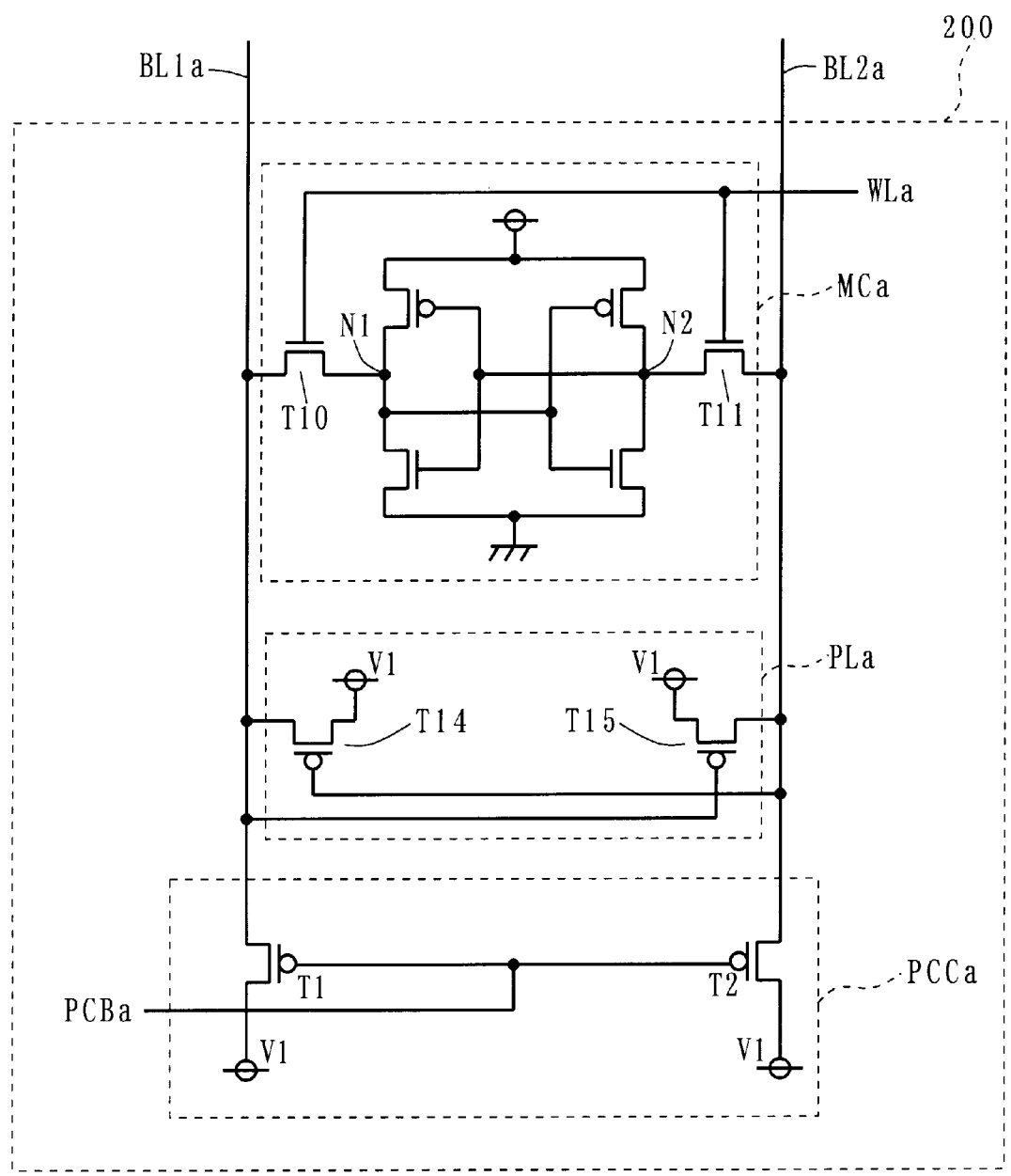

A sixth preferred embodiment according to the present invention is a combination of the fourth or fifth preferred embodiment and the third preferred embodiment. FIG. 16 is a circuit diagram for illustrating the semiconductor integrated circuit according to the sixth preferred embodiment of the present invention. FIG. 17 shows the internal construction of a circuit 200 shown in FIG. 16. The circuit shown in FIGS. 16 and 17 is provided by adding the bit line potential retaining circuit PL shown in FIG. 11 and a bit line potential retaining circuit PLa which is similar in internal construction to the bit line potential retaining circuit PL to the circuits of FIGS. 15 and 13. The bit line potential retaining circuit PLa comprises PMOS transistors T14 and T15. The transistor T14 of the bit line potential retaining circuit PLa has a source electrode receiving the precharge potential V1, a gate electrode connected to the bit line BL2a, and a drain electrode connected to the bit line BL1a. The transistor T15 of the bit line potential retaining circuit PLa has a source electrode receiving the precharge potential V1, a gate electrode connected to the bit line BL1a, and a drain electrode connected to the bit line BL2a.

Although shown in FIGS. 16 and 17 as a combination of the contents shown in FIGS. 15 and 13 and the contents shown in FIG. 11, the sixth preferred embodiment may be a combination of other contents described in the fifth or fourth preferred embodiment and the contents described in the third preferred embodiment.

Variations

The variations shown in FIGS. 7 and 8 may be applied to the third to sixth preferred embodiments.

Furthermore, a memory cell MC can have a structure other than the structure shown in the drawings.

While the invention has been described in detail, the foregoing description is in all aspects illustrative and not restrictive. It is understood that numerous other modifications and variations can be devised without departing from the scope of the invention.

I claim:

1. A semiconductor integrated circuit, comprising:

at least one bit line;

at least one memory cell connected to said bit line;

at least one precharge circuit connected to said bit line for precharging said bit line; and an electric potential converting circuit connected to said bit line for converting an electric potential of said bit line, wherein said electric potential converting circuit includes first to third transistors which are sequentially connected in series between first and second potentials, an output of said electric potential converting circuit is a node of said second and third transistors, said first transistor receives a mode signal at a control electrode and is turned OFF or ON depending on whether said mode signal indicates a predetermined mode, a control electrode of said second transistor is connected to said bit line, said third transistor receives said mode signal at a control electrode and is turned ON or OFF depending on whether said mode signal indicates said predetermined mode, and said precharge circuit receives said mode signal and precharges said bit line to an electric potential with which said second transistor is turned OFF only when said mode signal indicates said predetermined mode.

2. The semiconductor integrated circuit according to claim 1, wherein said precharge circuit includes a fourth transistor having a control electrode for receiving said mode signal, a first current electrode for receiving a precharge potential and a second current electrode connected to said bit line.

3. The semiconductor integrated circuit according to claim 2, wherein said precharge circuit further includes a fifth transistor which is diode-connected between said first current electrode and said precharge potential.

4. The semiconductor integrated circuit according to claim 1, wherein said bit line includes first and second bit lines;

said memory cell includes a first memory cell connected to said first bit line and a second memory cell connected to said second bit line;

said second transistor includes a sixth transistor for the first bit line and a seventh transistor for the second bit line, said sixth and seventh transistors being connected in parallel between said first and third transistors, said sixth transistor having a control electrode connected to said first bit line, said seventh transistor having a control electrode connected to said second bit line;

said predetermined mode is one of first and second predetermined modes;

said precharge circuit includes a first precharge circuit connected to said first bit line and a second precharge circuit connected to said second bit line;

said first precharge circuit precharges said first bit line to a potential at which said sixth transistor is turned OFF only when in said first predetermined mode; and said second precharge circuit precharges said second bit line to a potential at which said seventh transistor is turned OFF only when in said second predetermined mode.

5. The semiconductor integrated circuit according to claim 4, wherein said first transistor includes an eighth transistor for said first bit line, said eighth transistor being connected between said first potential and said sixth transistor, and a ninth transistor for said second bit line, said ninth transistor being connected between said first potential and said seventh transistor, said eighth transistor being turned ON/OFF depending on whether or not said mode signal indicates said first predetermined mode, said ninth transistor being turned ON/OFF depending on whether or not said mode signal indicates said second predetermined mode.

6. The semiconductor integrated circuit according to claim 5, wherein said third transistor includes a tenth transistor for said first bit line and an eleventh transistor for said second bit line, said tenth and eleventh transistors being connected in series between said second transistor and said second potential, said tenth transistor being turned ON/OFF depending on whether or not said mode signal indicates said first predetermined mode, said eleventh transistor being turned ON/OFF depending on whether or not said mode signal indicates said second predetermined mode.

7. The semiconductor integrated circuit according to claim 1, wherein said memory cell holds data to be outputted to said bit line, said semiconductor integrated circuit further comprising:
a bit line potential retaining circuit for selectively connecting said bit line to a potential at which said second transistor is turned OFF, depending on whether or not said data is at the potential at which said second transistor is turned OFF, when said mode signal indicates a mode different from said predetermined mode, wherein said electric potential converting circuit further includes a twelfth transistor connected between a connecting point of said second and third transistors and said second potential, said twelfth transistor being turned ON/OFF depending on whether or not said data is at the potential at which said second transistor is turned OFF when said mode signal indicates a mode different from said predetermined mode.

* * * * *